United States Patent [19]
Stall et al.

[11] Patent Number: 5,544,618
[45] Date of Patent: Aug. 13, 1996

[54] APPARATUS FOR DEPOSITING A COATING ON A SUBSTRATE

[76] Inventors: Richard A. Stall, 31 Wolf Hill Dr., Warren, N.J. 07060; Gary S. Tompa, 681-H Dover Ct., Somerville, N.J. 08876; Alexander Gurary, 618 Foothill Rd., Bridgewater, N.J. 08807; Craig R. Nelson, 67 Maple Ave., Berkeley Heights, N.J. 07922

[21] Appl. No.: 247,659

[22] Filed: May 23, 1994

Related U.S. Application Data

[62] Division of Ser. No. 803,647, Dec. 4, 1991, Pat. No. 5,336,324.

[51] Int. Cl.6 .......................... H01L 21/20; C30B 23/08
[52] U.S. Cl. .............................. 117/102; 117/108
[58] Field of Search ........................ 117/102, 108

[56] References Cited

U.S. PATENT DOCUMENTS

| | | | |
|---|---|---|---|
| 3,839,084 | 10/1974 | Cho et al. | 117/108 |
| 4,383,872 | 5/1983 | Robert | 117/108 |
| 4,740,263 | 4/1988 | Imai et al. | 117/102 |
| 4,911,102 | 3/1990 | Manabe et al. | 117/102 |
| 5,288,327 | 2/1994 | Bhat | 117/102 |
| 5,288,365 | 2/1994 | Furukawa et al. | 117/108 |

FOREIGN PATENT DOCUMENTS

| | | |
|---|---|---|
| 3715644 | 12/1988 | Germany. |
| 62-211912 | 9/1987 | Japan. |
| 63-134596 | 6/1988 | Japan. |
| 103996 | 4/1989 | Japan ............. 117/102 |
| 3083896 | 4/1991 | Japan. |

*Primary Examiner*—R. Bruce Breneman
*Assistant Examiner*—Linda J. Fleck
*Attorney, Agent, or Firm*—Lerner, David, Littenberg, Krumholz & Mentlik

[57] ABSTRACT

An apparatus for depositing a coating on a substrate substantially eliminates the occurrence of oval defects by creating a heated tortuous path through which the source material vapors must travel before depositing on the substrate. In addition, shut-off valves for each of the source materials are positioned in the reaction chamber in close proximity to the substrate, thereby enabling layers of different compositions to be deposited with sharp transitions between adjacent layers. The apparatus may be used to efficiently coat large areas uniformly, and works equally well with either elemental or chemical source materials, or certain combinations of both. The features of the coating apparatus may be embodied in replacement source cells for retrofitting in conventional molecular beam and chemical beam epitaxy units.

8 Claims, 17 Drawing Sheets

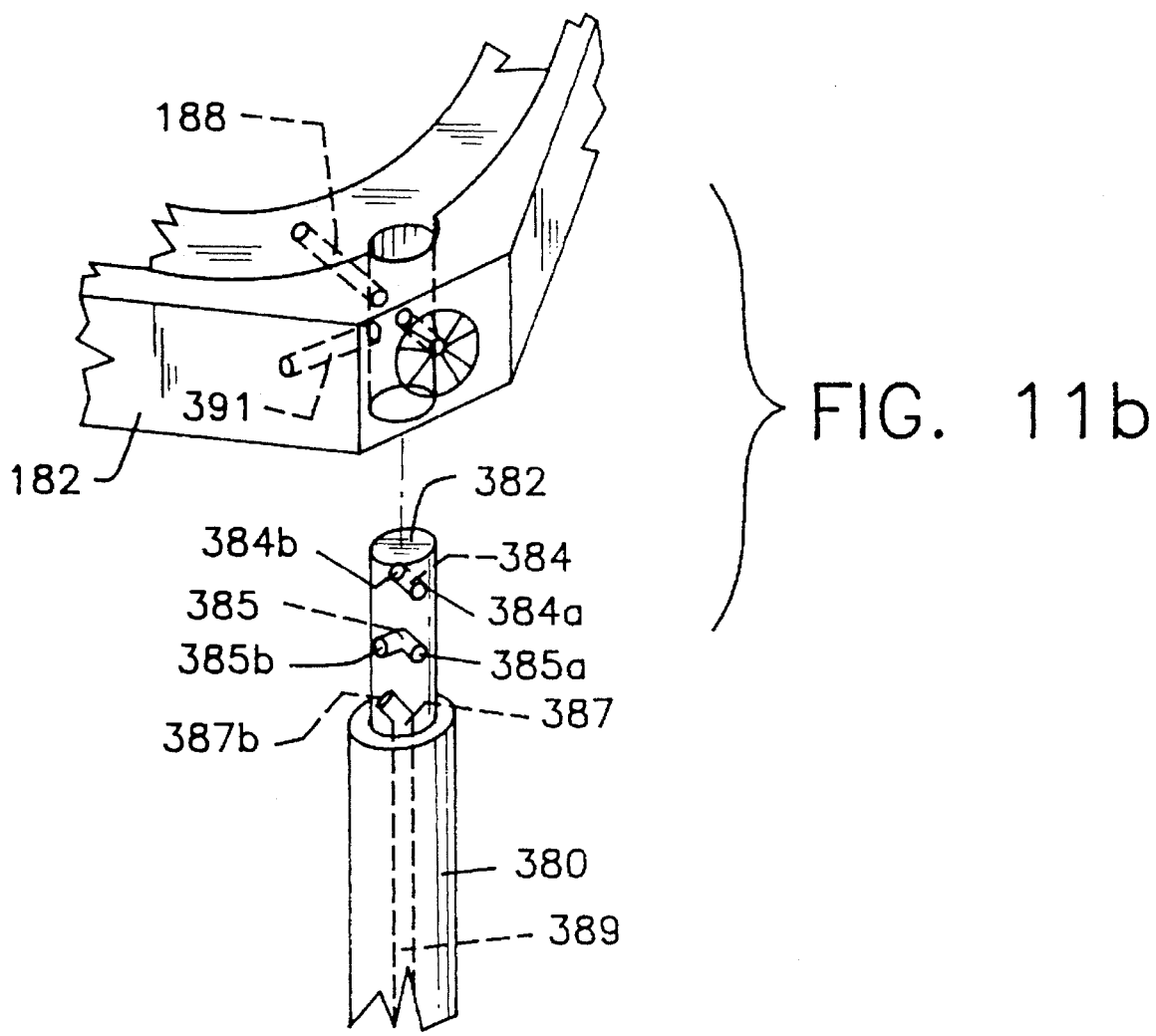

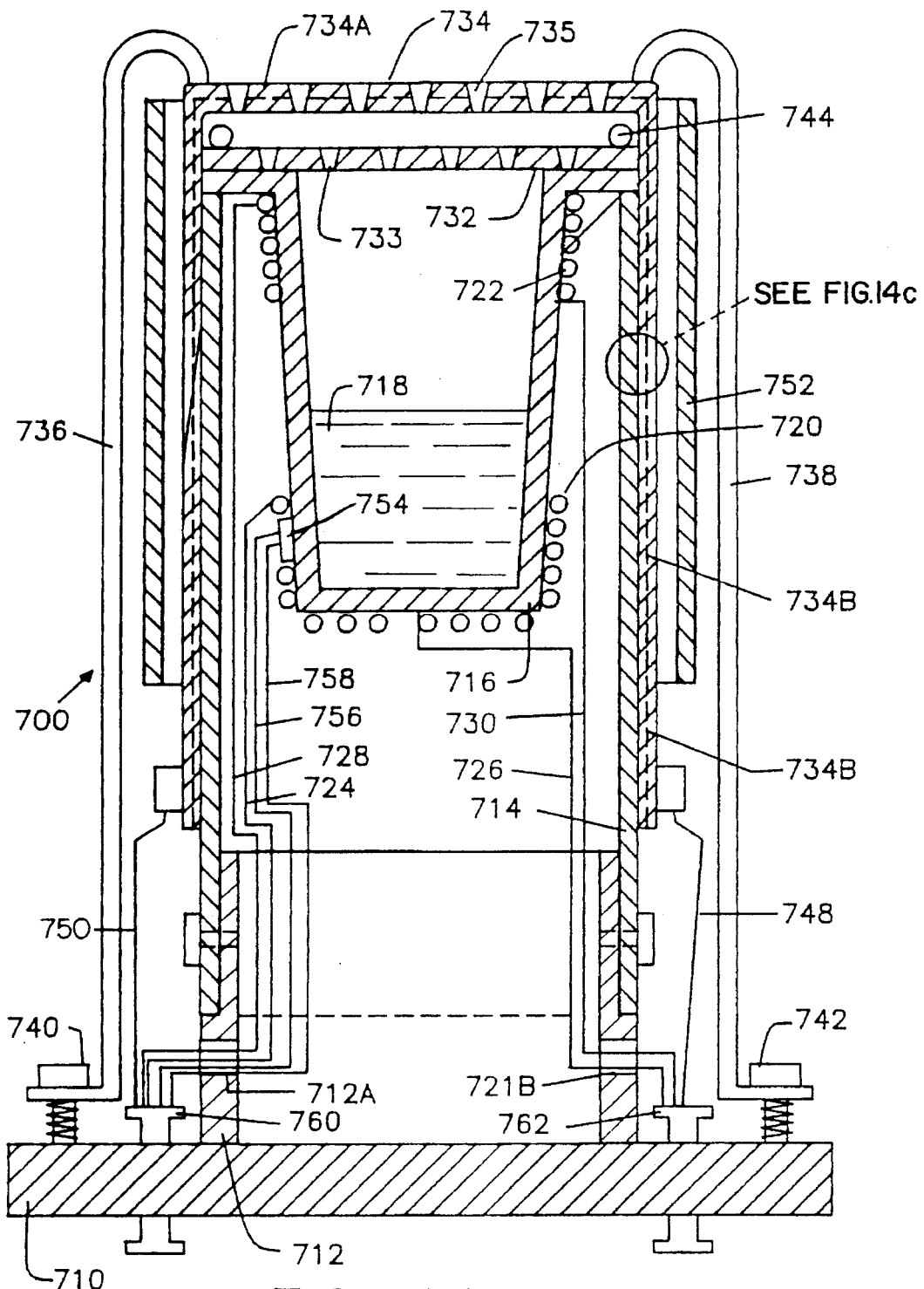
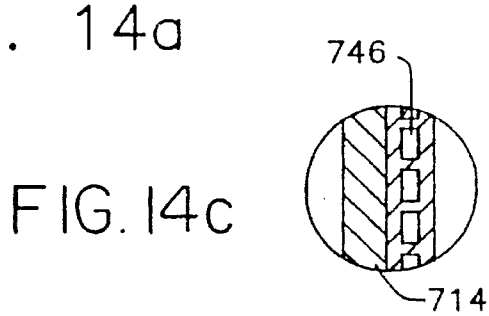
FIG. 14a
FIG. 14c

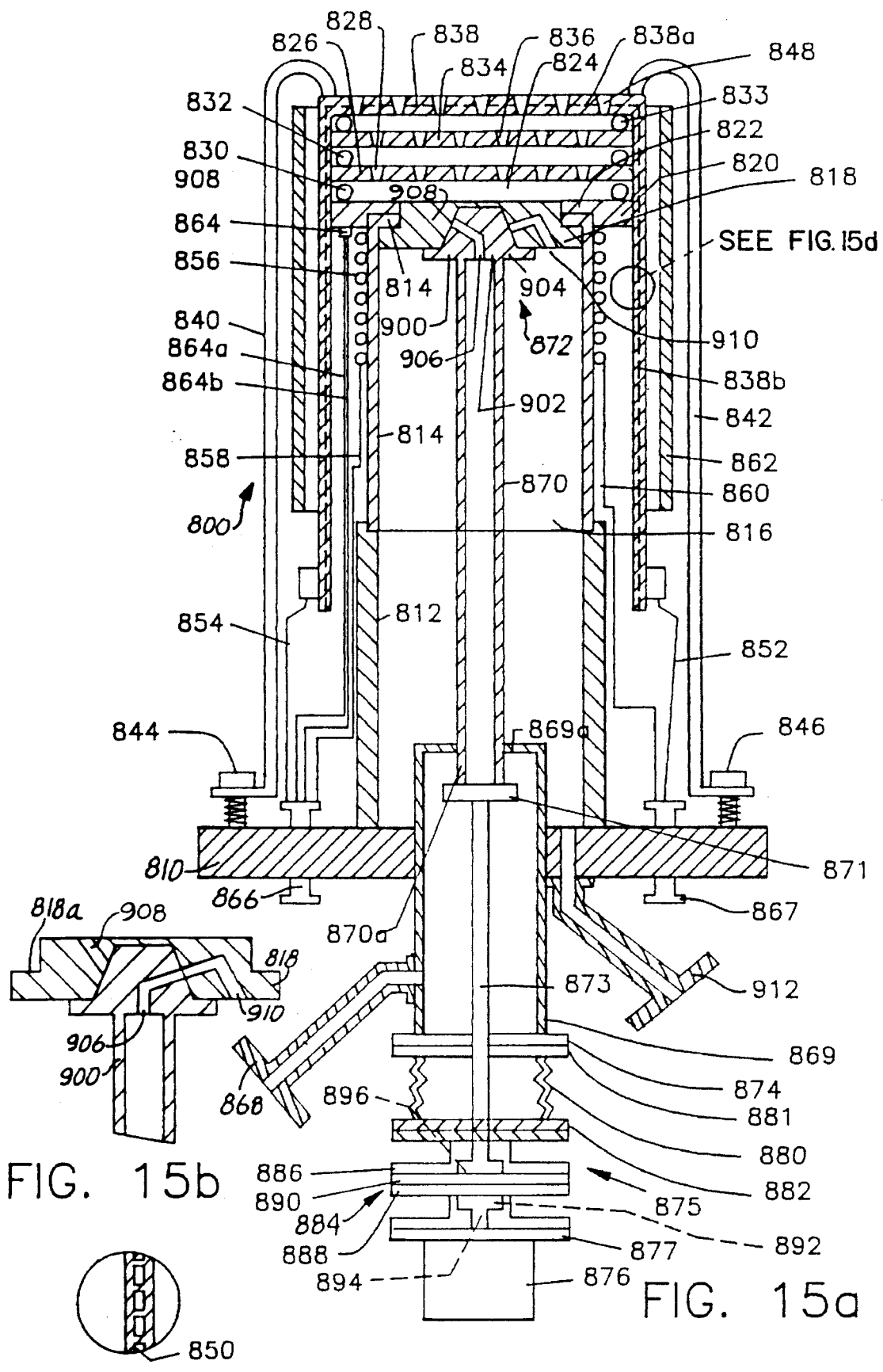

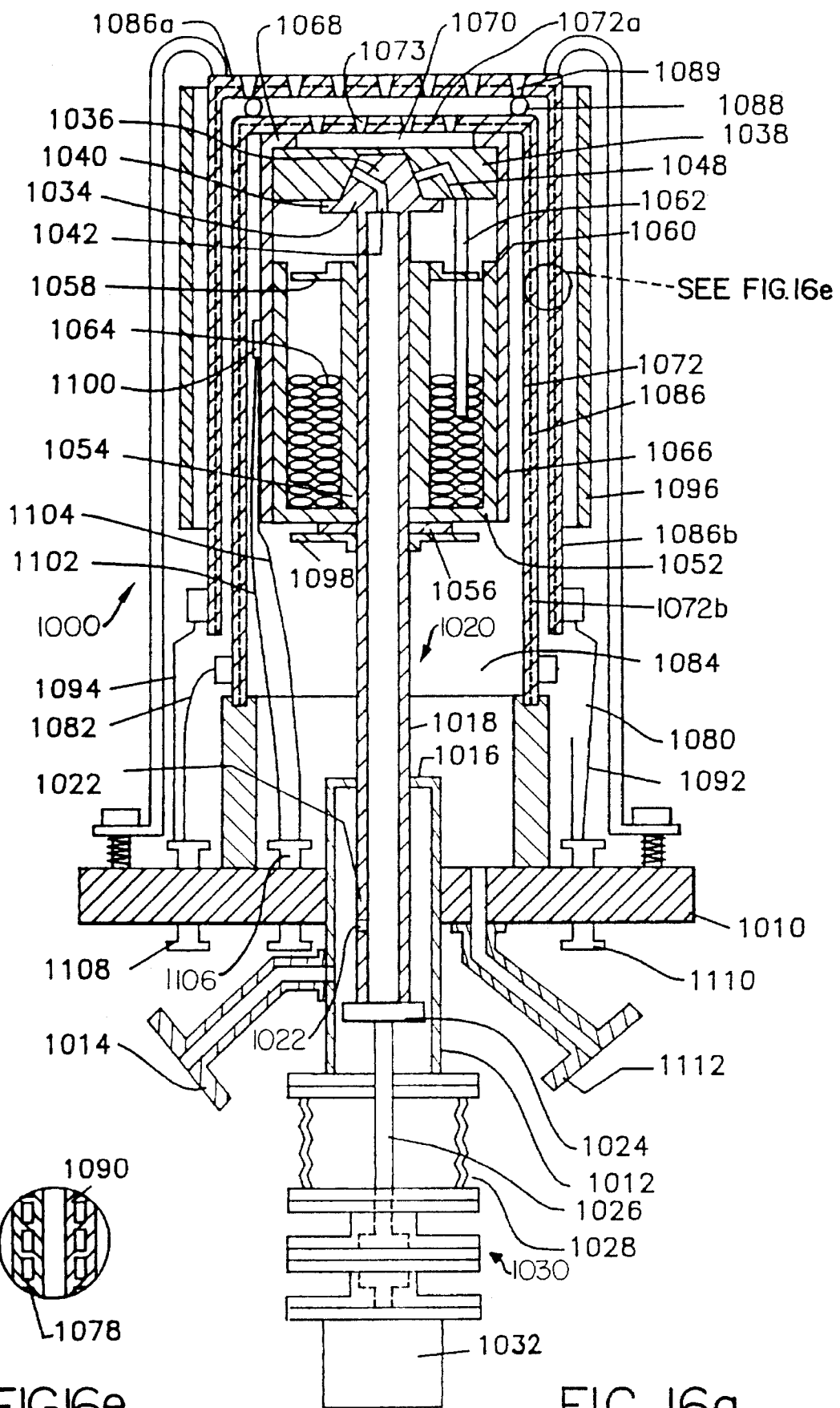

APPARATUS FOR DEPOSITING A COATING ON A SUBSTRATE

The U.S. Government has a paid-up license in this invention and the right in limited circumstances to require the patent owner to license others on reasonable terms as provided for by the terms of contract Nos. F33615-89-C-5654 and F33615-90-C-1487 awarded by the Materials Laboratories, Wright Research & Development Center, Aeronautical Systems Division; contract No. DASG60-91-0059 awarded by the Strategic Defense Initiative Organization; and Contract No. DAAH01-92-C-R280 awarded by the Defense Advanced Research Projects Agency.

This is a division of application Ser. No. 07/803,647 filed Dec. 4, 1991 now U.S. Pat. No. 5,336,324.

FIELD OF THE INVENTION

The present invention relates to apparatus and methods for depositing a coating on a substrate, and more particularly to apparatus and methods for depositing single or multiple epitaxial layers or metal films on wafer substrates during the preparation of semiconductor devices.

BACKGROUND OF THE INVENTION

Although various industries are extant which employ processes for forming a thin layer or film on a solid substrate, one significant industry in which such processes are widely employed is the production of semiconductor devices. In such production processes, substrates such as planar silicon or gallium arsenide wafers or other suitable such materials are exposed to gases which react to deposit the desired materials on the surface of the substrate or wafer. In typical processes of this nature, the deposited materials thus form epitaxial films which replicate the crystal lattice structure of the underlying substrate.

These coated wafers are then subjected to well known further processes to form devices such as integrated circuits. The layers deposited on the wafer form the active elements of microscopic transistors and other semiconductor devices included in the integrated circuits. The thickness, composition and quality of the deposited layers determine the characteristics of the resulting semiconductor devices. Accordingly, the deposition process must be capable of depositing films of uniform composition and thickness on the front face of each substrate. The requirements for uniformity have become progressively more stringent with the use of larger wafers and with the continuing reduction in the size of the semiconductor devices fabricated from the coated wafers.

Several processes are currently utilized in the semiconductor industry to deposit these very thin epitaxial layers on wafer substrates. Among these, the more significant and widely employed processes include molecular beam epitaxy, chemical beam epitaxy and metallorganic chemical vapor deposition. All of these techniques have inherent drawbacks which either diminish the quality of the resultant semiconductor devices or render the deposition process lengthy, difficult and costly.

In a typical molecular beam epitaxy (MBE) system, two or more source materials are separately heated in effusion cells to thus generate individual beams consisting of molecules (or atoms) of these materials. The individual beams of molecules then travel under molecular flow conditions toward the surface of a heated substrate where they react to deposit a layer of a desired composition on the substrate surface. As used herein, the term "molecular flow" refers to material flow in which individual molecules of the material can move freely without colliding with one another. Molecular flow through a vessel exists where the mean free path of a molecule (i.e. the distance traveled without collision) is greater than the smallest characteristic dimension of the vessel. Although widely used, the molecular beam epitaxy technique has many inherent deficiencies which plague the production process and limit the coating quality obtainable therewith. Firstly, the proportion of source materials to be deposited in a particular layer can only be changed by adjusting the temperatures of the individual effusion cells. Not only does this provide a woefully inadequate level of control, but it slows the production process since it requires extended lengths of time for the effusion cells to reach the required temperature. During this temperature adjustment period, the flow of the source material beams must be interrupted by positioning shutters between the effusion cell sources of the beams and the substrate target. Since these shutters do not make a physical seal they leak, and therefore are ineffective in completely preventing any additional deposition. A further deficiency of the molecular beam epitaxy process is that it inherently causes the formation of defects in the deposited layer. Such defects are caused, for example, by microscopic droplets which form when the vapor pressure immediately above the molten source material causes condensation or "spitting" or when molecules of material from one source beam collide with molecules of material from another source beam, the microscopic droplets then adhering to the surface of the substrate to form what are typically referred to as oval defects. Finally, the molecular beam epitaxy deposition process must be conducted at very high vacuum levels on the order of $10^{-11}$ Torr, and therefore requires the use of highly specialized and very expensive equipment.

In the alternate coating process of metallorganic chemical vapor deposition (MOCVD), gaseous hydride sources and metallorganic vapor sources flow with a carrier gas through a plurality of apertures in a diffuser plate wherein the gas flow is divided into a plurality of individual streamlines or flow lines directed at the substrate. A heated susceptor in close proximity to the substrate causes the gases to decompose into elemental materials as they hit and become deposited on the substrate. The composition of the deposited layer is determined by adjusting the proportional flow rate of the various source gases, and is therefore able to be controlled more accurately than with molecular beam epitaxy. The interface abruptness between adjacent layers is developed by controlling the source material flow between a run condition and a vent condition without leakage. Furthermore, the metallorganic chemical vapor deposition process may be conducted at relatively low vacuum levels of about 60 Torr, therefore overcoming the stringent equipment requirements associated with molecular beam epitaxy. This process, however, effects an entirely different set of problems, the most significant of which are associated with the source materials themselves since the metallorganic gases required for this process are not only expensive to produce, but are also dangerous to use and dispose of because of their explosiveness and toxicity. Moreover, these gases exhibit viscous flow characteristics as they travel from the diffuser plate for deposition on the substrate. Such flow cannot be effectively controlled and consequently results in the formation of surfaces on the substrates which are non-uniform with respect to both thickness and composition. In addition, the decomposition of the source gases at or near the surface of the substrate often results in carbon contamination of the deposited layer.

The chemical beam epitaxy (CBE) deposition process combines the attributes of both molecular beam epitaxy and metallorganic chemical vapor deposition. In accordance with this process, gaseous sources are fed to cracking cells from which they flow towards a heated substrate. While some gases decompose in the cracking cells, others decompose at the surface of the heated substrate. Since the chemical beam epitaxy process does not require the use of toxic metallorganic source gases, it overcomes those problems inherent in metallorganic chemical vapor deposition which are attributable to the use of these materials. However, chemical beam epitaxy must be performed at higher vacuum levels than MOCVD which are on the order of about $10^{-5}$ Torr. Moreover, the growth rate of the deposited layer is dependent on the temperature of the substrate surface, and is therefore difficult to control, while the deposited layer is again subject to carbon contamination due to the decomposition of the gases near the substrate surface.

In view of the deficiencies of the aforementioned deposition processes, it has been extremely difficult heretofore to consistently produce coated wafers having substantially no defects. Accordingly, there is a need for an improved process and apparatus which is capable of depositing defect-free thin layers on a substrate in an economical manner. Not only should such process be easy to perform and control, but it should eliminate the need to use toxic and/or expensive source materials, and should use the required materials efficiently. Furthermore, the process should not require the use of highly specialized equipment which is troublesome to operate. In other words, there is a need for both a commercially viable process and an apparatus for performing that process which can provide for the deposition of more uniform layers on substrates with substantially no defects.

SUMMARY OF THE INVENTION

In accordance with one aspect of the present invention, these needs have now been addressed by the invention of a vapor supply device which may be mounted in a coating deposition apparatus having a chamber, including the reaction chambers of conventional molecular beam and chemical beam epitaxy units. The vapor supply device includes at least one inlet for a vapor, an outlet for the vapor, means for defining a tortuous path between the at least one vapor inlet and the vapor outlet, heating means for heating the tortuous path and mounting means for mounting the device at a preselected position in the chamber. A key feature of the invention is the development of high temperature valving which allows MBE-like elemental vapor sources to be treated like the vapor sources associated with MOCVD processes.

In accordance with one embodiment of the device of the present invention, the means for defining the tortuous path includes a plurality of superposed members spaced apart from one another, each of the members having a plurality of apertures arranged in a predetermined pattern, the apertures in at least one of the members being out of alignment with the apertures in an adjacent one of the members. Preferably, the apertures in each one of the members are out of alignment with the apertures in adjacent ones of the members. More preferably, one of the plurality of superposed members defines the vapor outlet.

In accordance with another embodiment of the present invention, the vapor supply device further includes a body defining a cavity, wherein the at least one vapor inlet includes a first inlet extending through the body and communicating with the cavity for supplying the vapor to the cavity and the vapor outlet communicates with the cavity for enabling the vapor to exit the cavity. This embodiment further includes valve means disposed in the body to control the flow of the vapor through the first inlet. In preferred embodiments, the valve means includes a valve element moveable with respect to the body between a first position in which the valve element occludes the first inlet and a second position in which the valve element does not occlude the first inlet, the valve element variably occluding the first inlet between the first and second positions. In more preferred embodiments, the heating means consists of a heating element disposed in the cavity. In even more preferred embodiments, the body is formed from a first material having a coefficient of thermal expansion and the valve means is formed from a second material having a coefficient of thermal expansion which is substantially similar to the coefficient of thermal expansion of the first material. In still more preferred embodiments, the body and the valve means are formed from a first material and one of the body and the valve means includes a surface coating of a second material different from the first material.

In yet another embodiment, the at least one inlet consists of a plurality of inlets extending through the body and communicating with the cavity for supplying a plurality of vapors to the cavity. This embodiment preferably includes valve means disposed in the body for controlling the flow of each of the plurality of vapors through the plurality of inlets. More preferably, the valve means includes a valve element disposed in each of the plurality of inlets, each valve element being moveable with respect to the body between a first position in which the valve element occludes the first inlet and a second position in which the valve element does not occlude the first inlet, the valve element variably occluding the first inlet between the first and second positions. In highly preferred embodiments of this device, the means for defining a tortuous path consists of a plurality of superposed members spaced apart from one another, each of the members having a plurality of apertures arranged in a predetermined pattern, the apertures in at least one of the members being out of alignment with the apertures in an adjacent one of the members. More preferably, the apertures in each one of the members are out of alignment with the apertures in adjacent ones of the members. Even more preferably, one of the plurality of superposed members defines the vapor outlet.

In still another embodiment of the device of the present invention, the means for defining a tortuous path consists of a plurality of superposed members spaced apart from one another, each of the members having a plurality of apertures arranged in a predetermined pattern, the apertures in at least one of the members being out of alignment with the apertures in an adjacent one of the members, and an outermost one of the members defining a shell extending around the body. In preferred embodiments, the valve means includes a valve element moveable with respect to the body between a first position in which the valve element occludes the first inlet and a second position in which the valve element does not occlude the first inlet, the valve element variably occluding the first inlet between the first and second positions. The valve means further includes a shaft extending from the valve element for supporting the body and the shell. In other preferred embodiments, the plurality of members define a plurality of concentric cylinders extending around the body, wherein an outermost one of the concentric cylinder holds the body, the valve means and the plurality of members in assembled position.

In yet a further embodiment of the present invention, the vapor supply device further includes exhaust outlet means defining a vapor flow path leading in a direction away from the vapor outlet, and valve means disposed in the body and moveable between a run position and a vent position, the valve means in the run position directing the vapor toward the tortuous path and the vapor outlet, and the valve means in the vent position directing the vapor toward the exhaust outlet means. A more preferred embodiment of this device further includes a carrier gas inlet, wherein the valve means is moveable to a purge position for terminating the flow of the vapor and for directing the carrier gas toward the tortuous path and the vapor outlet. A still more preferred embodiment of this device further includes receptacle means within the chamber for containing a source material, vaporizing means for creating the vapor from the source material, and means defining a passage for conducting the vapor from the receptacle means to the at least one inlet. In highly preferred embodiments, the valve means consists of valve seat means defining the run position and the vent position, a valve element rotatably mounted with respect to the valve seat means, and a hollow shaft connected for rotation with the valve element and defining the at least one inlet.

In another aspect of the present invention, a vapor supply device for use in a coating deposition apparatus having a chamber includes a body defining a cavity, at least one inlet for a vapor extending through the body and communicating with the cavity for supplying the vapor to the cavity, an outlet for the vapor communicating with the cavity for enabling the vapor to exit the cavity, valve means disposed in the body for controlling the flow of the vapor through the at least one vapor inlet, and means for mounting the body within the chamber so that the valve means is adjacent to a substrate to be coated.

In one embodiment of this device, the valve means consists of a valve element moveable with respect to the body between a first position in which the valve element occludes the first inlet and a second position in which the valve element does not occlude the first inlet, the valve element variably occluding the first inlet between the first and second positions.

In another embodiment of this device, the body is formed from a first material having a coefficient of thermal expansion and the valve means is formed from a second material having a coefficient of thermal expansion which is substantially similar to the coefficient of thermal expansion of the first material. Preferably, the body and the valve means are formed from a first material and one of the body and the valve means includes a surface coating of a second material different from the first material.

In yet another embodiment, the vapor supply device further includes exhaust outlet means defining a vapor flow path leading in a direction away from the vapor outlet and valve means disposed in the body and moveable between a run position and a vent position, the valve means in the run position directing the vapor toward the vapor outlet, and the valve means in the vent position directing the vapor toward the exhaust outlet means. Preferred embodiments of this device further include a carrier gas inlet, wherein the valve means is moveable to a purge position for terminating the flow of the vapor and for directing the carrier gas toward the vapor outlet. More preferred embodiments of this device further include receptacle means within the chamber for containing a source material, vaporizing means for creating the vapor from the source material, and means defining a passage for conducting the vapor from the receptacle means to the at least one inlet. In highly preferred embodiments, the valve means consists of valve seat means defining the run position and the vent position, a valve element rotatably mounted with respect to the valve seat means, and a hollow shaft connected for rotation with the valve element and defining the at least one inlet.

Still another aspect of the present invention provides an apparatus for depositing a coating on a substrate. In accordance with this aspect of the present invention, the apparatus includes a housing, exhaust means for evacuating the housing, substrate support means arranged within the housing for supporting the substrate at a predetermined position, at least one inlet for a vapor, an outlet for the vapor within the housing and adjacent the substrate, means for defining a tortuous path between the at least one vapor inlet and the vapor outlet, vapor supply means for supplying the vapor to the at least one vapor inlet, and heating means for heating the tortuous path.

In accordance with one embodiment of this aspect of the present invention, the means for defining the tortuous path consists of a plurality of superposed members spaced apart from one another, each of the members having a plurality of apertures arranged in a predetermined pattern, the apertures in at least one of the members being out of alignment with the apertures in an adjacent one of the members. Preferably, the apertures in each one of the members are out of alignment with the apertures in adjacent ones of the members. Still more preferably, one of the superposed members defines the vapor outlet.

In accordance with another embodiment of the present invention, the coating apparatus further includes a body disposed within the housing at a spaced distance from the predetermined position, the body defining a cavity, the at least one vapor inlet including a first inlet extending through the body and communicating with the cavity for supplying the vapor to the cavity, and the vapor outlet communicating with the cavity for enabling the vapor to exit the cavity. In preferred embodiments, the heating means consists of a heating element disposed in the cavity. In more preferred embodiments, the apparatus further includes valve means disposed in the body for controlling the flow of the vapor through the first inlet. In still more preferred embodiments, the valve means consists of a valve element moveable with respect to the body between a first position in which the valve element occludes the first inlet and a second position in which the valve element does not occlude the first inlet, the valve element variably occluding the first inlet between the first and second positions.

In still another embodiment of the coating apparatus of the present invention, the at least one inlet includes a plurality of inlets extending through the body and communicating with the cavity for supplying a plurality of vapors to the cavity, the coating apparatus further including valve means disposed in the body for controlling the flow of each of the plurality of vapors through the plurality of inlets.

In yet another embodiment of the present invention, the coating apparatus further includes valve means disposed in the at least one inlet and moveable between a run position and a vent position, the valve means in the run position directing the vapor toward the tortuous path and the vapor outlet, and the valve means in the vent position directing the vapor toward the exhaust means. More preferred embodiments of this coating apparatus further include a carrier gas inlet, wherein the valve means is moveable to a purge position for terminating the flow of the vapor and for directing the carrier gas toward the tortuous path and the vapor outlet. In even more preferred embodiments, the vapor supply means consists of receptacle means for holding a source material, vaporizing means for creating the vapor from a source material disposed in the receptacle means, and means defining a passage for conducting the vapor from the receptacle means to the at least one vapor inlet. The receptacle means may be disposed within the housing and the coating apparatus may further include flow control means disposed between the receptacle means and the at least one vapor inlet for controlling the flow of the vapor to the at least one vapor inlet. Alternatively, the receptacle means may be disposed exterior of the housing and the apparatus may further include flow control means disposed between the receptacle means and the at least one vapor inlet for controlling the flow of the vapor to the at least one vapor inlet. Preferably, this latter embodiment further includes heating means for maintaining a portion of the source material in a vaporized state between the receptacle means and the at least one vapor inlet. In highly preferred embodiments, the valve means consists of valve seat means defining the run position and the vent position, a valve element rotatably mounted with respect to the valve seat means, and a hollow shaft connected for rotation with the valve element and defining the at least one inlet.

Still another aspect of the present invention provides a method for depositing a coating of a desired composition on a substrate, which method consists of supporting the substrate within a housing, evacuating the housing, providing vapors of materials for forming the composition to the housing, and conducting the vapors through a tortuous path in the housing having heated surfaces whereby the vapors contact the heated surfaces before depositing on the substrate.

In accordance with one embodiment of the method of the present invention, the step of providing vapors of materials for forming the composition to the housing further includes the steps of conducting a vapor of a first material for forming the composition to a first inlet, terminating the flow of the vapor of the first material by occluding the first inlet within the housing at a location adjacent to the substrate, and conducting a vapor of a second material for forming the composition through a second inlet. In highly preferred embodiments of this method, the step of occluding the first inlet includes moving a valve element disposed in the inlet from a non-occluding position to an occluding position.

In accordance with another embodiment of the method of the present invention, the step of providing vapors of materials for forming the composition to the housing consists of generating the vapors within the housing adjacent to the tortuous path.

In accordance with yet another embodiment, the method of the present invention further includes the step of conducting the vapors through valve means moveable between a run position and a vent position, the valve means in the run position directing the vapors toward the tortuous path and the valve means in the vent position directing the vapors away from the tortuous path. Preferred embodiments of this method further include the step of supplying a carrier gas to the housing, wherein the valve means is moveable to a purge position for terminating the flow of the vapors and directing the carrier gas toward the tortuous path for purging a remnant portion of the vapors from the tortuous path.

In accordance with still another embodiment, the method of the present invention further consists of the steps of providing a vapor of a first material for forming the composition to the housing and providing a vapor of a second material for forming the composition to the housing, wherein the vapors of the first and second materials are at least partially mixed together in the tortuous path.

A still further aspect of the present invention provides a method for depositing a coating of a desired composition on a substrate, consisting of supporting the substrate within a housing, evacuating the housing, providing vapors of materials for forming the composition to the housing through an inlet, and terminating the flow of the vapors by occluding the inlet within the housing at a location adjacent the substrate.

BRIEF DESCRIPTION OF THE DRAWINGS

A more complete appreciation of the subject matter of the present invention and the various advantages thereof can be realized by reference to the following detailed description, in which reference is made to the accompanying drawings in which:

FIG. 11b is an exploded partial perspective view of an alternate embodiment of the flux box shut-off valve;

FIG. 12 is a sectional view taken along line XII—XII of FIG. 11a;

FIG. 14a is an elevational sectional view of one embodiment of a source cell in accordance with the present invention for replacement in a conventional epitaxy unit;

FIG. 14c is an enlarged detailed view showing the heating element embedded within the wall of the flux distribution member shown in FIG. 14a;

FIG. 15a is an elevational sectional view of another embodiment of a replacement source cell in accordance with the present invention, showing the valve mechanism thereof in the run position;

FIG. 15b is an enlarged partial sectional view showing the valve mechanism of the source cell of FIG. 15a in the vent/purge position;

FIG. 15c is an enlarged partial plan view of the valve mechanism of the source cell shown in FIGURE 15a;

FIG. 15d is an enlarged detailed view showing the heating element embedded within the wall of the flux distribution member shown in FIG. 15a;

FIG. 16a is an elevational sectional view of yet another embodiment of a replacement source cell in accordance with the present invention, showing the valve mechanism thereof in the purge position;

FIG. 16d is an enlarged partial plan view of the valve mechanism of the source cell shown in FIG. 16a;

FIG. 16e is an enlarged detailed view showing the heating elements embedded within the walls of the flux distribution members shown in FIG. 16a;

FIG. 17a is an elevational sectional view of still another embodiment of a replacement source cell in accordance with the present invention, showing the valve mechanism thereof in the run position;

FIG. 17b is an enlarged partial sectional view showing the valve mechanism of the source cell of FIG. 17a in the vent position; and FIG. 17c is an enlarged partial plan view of the valve mechanism of the source cell shown in FIG. 17a.

FIG. 17d is an enlarged detailed view showing the heating elements embedded within the walls of the flux distribution members shown in FIG. 17a.

DETAILED DESCRIPTION OF THE PREFERRED EMBODIMENTS

Figure 1:
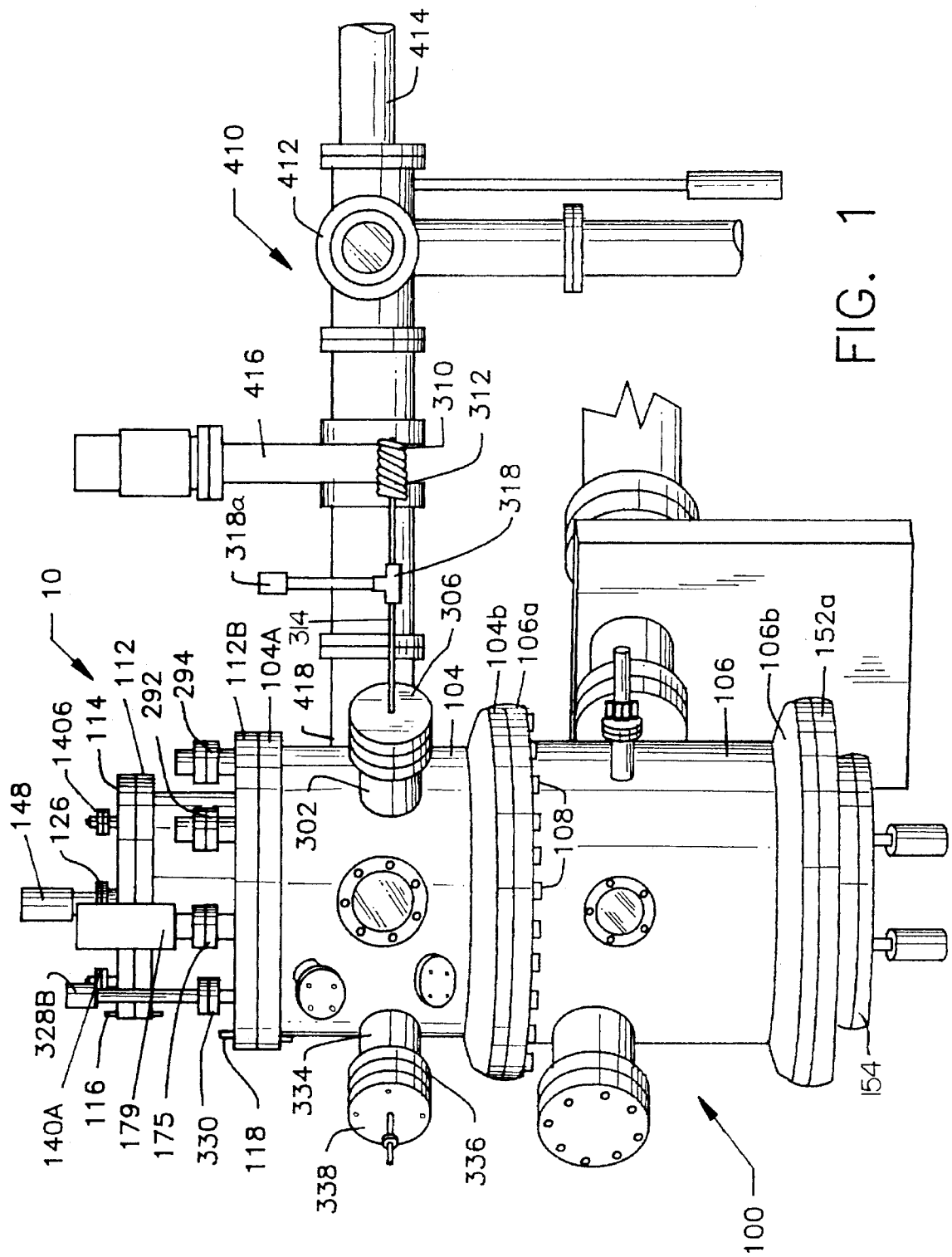
FIG. 1 is a front elevational view of a coating apparatus in accordance with the present invention.
Figure 2:
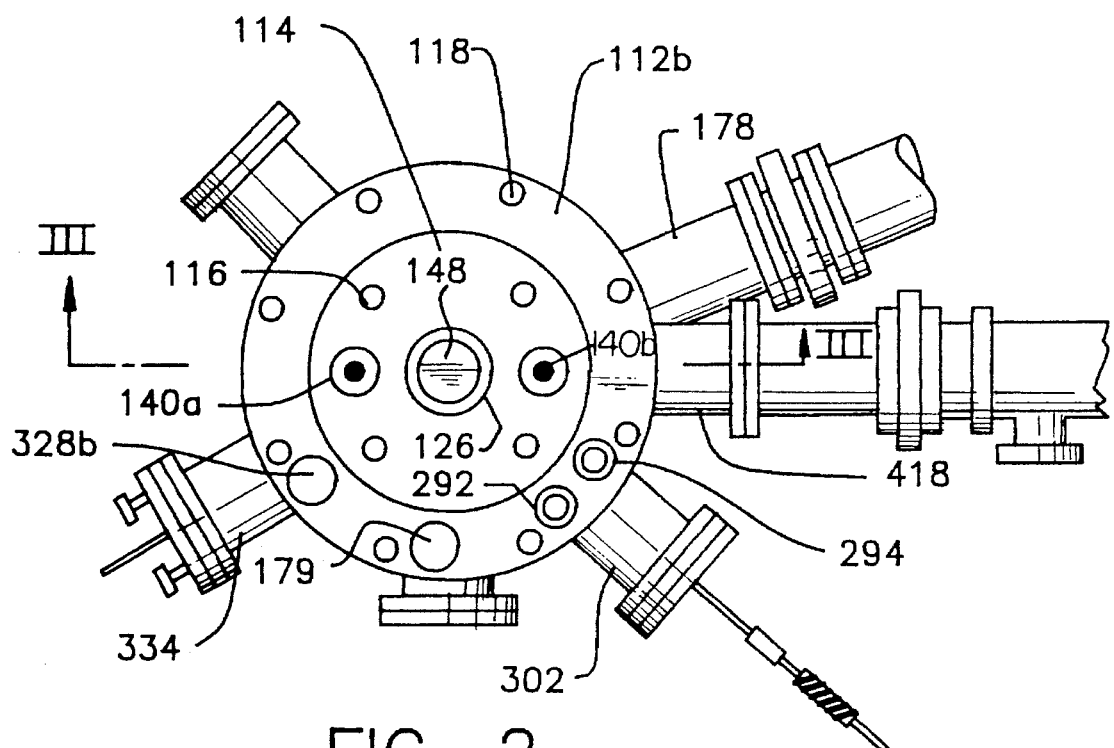
FIG. 2 is a top plan view of the coating apparatus of FIG. 1.

The apparatus and method of the present invention are applicable in a broad range of processes in which it is desired to accurately and repeatably deposit a thin coating on a substrate. Such processes may include, for example, the deposition of optical coatings, magnetic coatings, hardened coatings on tooling, and the like. In the description which follows, however, the present invention will be described in connection with a system for depositing an epitaxial layer on at least one face of a planar semiconductor wafer. Preferably, such system comprises a part of an overall integrated system of work stations for processing such wafers during the production of semiconductor devices therefrom. As suggested above, however, the apparatus and method of the present invention may just as successfully be used for applying a coating with a high degree of uniformity to substrates having contoured or three-dimensional surfaces.

Referring to the figures, one preferred embodiment of an apparatus 10 for depositing an epitaxial layer on a semiconductor wafer in accordance with the present invention is illustrated in FIGS. 1–4. Generally, the apparatus consists of a housing defining a reaction chamber 100 having a cylindrical sidewall 102 formed from an upper cylindrical sidewall member 104 and a lower cylindrical sidewall member 106. Upper sidewall member 104 and lower sidewall member 106 have about the same diameter, with upper sidewall member 104 including a lower annular flange 104b which mates with an upper annular flange 106a formed on lower sidewall member 106, and which is bolted thereto by means of bolts 108. A gasket (not shown) disposed between flanges 104b and 106a provides a vacuum-tight seal between sidewall members 104 and 106. Preferably, this gasket, as well as the other gaskets used in assembling the apparatus of the present invention, is formed from a metallic material which is capable of withstanding the elevated operating temperatures at which the apparatus is intended to operate. Thus, elastomeric seals are avoided when assembling the apparatus of the present invention since such seals may deteriorate and outgas at these elevated temperatures, thereby reducing the quality of the vacuum within the reaction chamber 100 and introducing contaminants into the deposition process.

The upper end of reaction chamber 100 is enclosed by an upper closure member 110 having a cylindrical sidewall 112 which, as illustrated, may have a smaller diameter than that of cylindrical sidewall 102. An upper wall member 114 is mated in a vacuum-tight manner to an upper annular flange 112a provided on sidewall 112 and is bolted thereto by means of bolts 116. A lower annular outer flange 112b mates in a vacuum-tight manner with an annular flange 104a provided on the upper end of upper sidewall member 104, and is bolted thereto by means of bolts 118. A central region of upper wall member 114 includes an aperture, the periphery of which is provided with a cylindrical input tube 120. This input tube 120 includes an annular upper flange 122 having a conventional linear motion feedthrough 126 connected thereto for assembling a wafer support and positioning mechanism 128 to reaction chamber 100 in a vacuum-tight manner.

Mechanism 128 is formed in a conventional fashion for positioning, supporting and heating a wafer within reaction chamber 100. Thus, mechanism 128 includes a shaft 130 having a base plate 132 mounted thereon. Beneath base plate 132, mechanism 128 includes a resistance heating element 134 connected by electrodes 136a and 136b to annular graphite contacts 138a and 138b. The graphite contacts 138a and 138b, in turn, slidingly engage a pair of electrodes 139a and 139b which connect through vacuum-tight electrical feedthroughs 140a and 140b to a power source (not shown). Mounted directly above the heating element 134 are a plurality of heat shields 142, 143 and 144 which are designed to localize the effect of heating element 134, particularly to that area where a wafer W is positioned. Electrodes 136a, 136b, 139a and 139b and heat shields 142, 143 and 144 are all preferably formed from molybdenum, but may also be fabricated from other such refractory materials.

Mounted directly beneath heating element 134 is a diffusion plate 145 which separates heating element 34 from a susceptor 146 which is intended to support at least one wafer at a fixed distance from heating element 34. Susceptor 146 includes a shallow groove 147 in the upper surface thereof that defines a "pocket" in which a wafer carrier 151 holding the wafer W is placed. Susceptor 146 and wafer carrier 151 are also preferably formed from molybdenum, but once again other refractory materials could be substituted therefor. A micrometer 148, operatively connected through linear motion feedthrough 126 to shaft 130, is operated in a known fashion to adjust the vertical position of wafer W within reaction chamber 100.

At its lower end, reaction chamber 100 is enclosed by a lower closure member 150 having a cylindrical sidewall 152 which, as illustrated, may have a diameter which is smaller than the diameter of cylindrical sidewall 102. A lower wall member 154 creates a vacuum-tight seal with a lower annular flange 152b on lower closure member 150, and is bolted thereto by means of bolts 156. An upper annular outer flange 152a is joined to a lower annular flange 106b provided on lower sidewall member 106 by means of bolts 158, again forming a vacuum-tight seal. As shown more clearly in FIG. 5, a series of rods 160, 162, 164 and 166 are connected near the center of lower wall member 154 and extend upwardly therefrom. At their free ends, rods 160, 162, 164 and 166 are connected to a plate 168, which in turn has rods 170, 172, 174 and 176 extending upwardly therefrom. Rods 160–166, plate 168 and rods 170–176 together form a support structure for a flux box assembly 180 which will be described more fully below. A substrate shutter 177 may be pivoted in and out of position between flux box assembly 180 and susceptor 146 by rotating a knob 179 connected thereto by a rotary motion feedthrough 175.

Lower sidewall member 106 also includes an exhaust connection 178 extending outwardly therefrom, so that reaction chamber 100 can be evacuated to a pressure as low as about $1 \times 10^{-11}$ Torr and so that any exhaust gases generated during the deposition process of the present invention can be evacuated through exhaust connection 178, which can in turn be appropriately connected to an exhaust conduit, vacuum pump, or the like, as desired.

The structure of flux box assembly 180 can be seen in detail by referring to FIGS. 6–12. Thus, flux box assembly 180 has a body 182, the top of which is recessed to define a cavity 184 having a lip 186 formed along the circumference thereof. Tapered apertures 188 and 190 extend from the exterior of body 182 to communicate with cavity 184. As will be discussed more fully below, apertures 188 and 190 each serve as an inlet for a vapor of a source material which is ultimately to be deposited on the surface of wafer W. As will also be discussed more fully below, body 182 is provided with a conically-shaped hole 189 traversing inlet aperture 188 and accommodating a shut-off valve to positively stop the flow of a source vapor through aperture 188 and into cavity 184. A similar conically-shaped hole 191 traverses inlet aperture 190 and accommodates a shut-off valve which stops the flow of another source vapor through aperture 190 and into cavity 184. Although only two such apertures 188 and 190 are shown in the figures and discussed herein, it will be appreciated from the discussion which follows that body 182 may be provided with additional such apertures in order to accommodate additional and different vapor sources. In accordance with this description, flux box assembly 180 serves as a manifold for the reception and subsequent distribution of vapors from a plurality of sources.

Flux box assembly 180 further includes a diffuser plate 192 which rests in assembled position upon the upper surface of body 182, thus enclosing cavity 184. As clearly shown in FIG. 10, diffuser plate 192 includes a plurality of apertures 194 having a select diameter which are arranged in a predetermined pattern consisting of concentric bands of apertures 196, 198, 200, 202 and 204 in order to provide a uniform flow of gases out from flux box assembly 180 towards wafer W. Attached to that surface of diffuser plate 192 which faces cavity 184 when diffuser plate 192 is in assembled position on body 182 is an electrical resistance heating element 210 which includes two spaced apart heating portions 212 and 214 formed from graphite or some other such composition which is typically used as an electrical resistance heating material. Heating portions 212 and 214 each have a configuration which resembles a series of concentric rings with connecting members joining adjacent rings to one another in a serpentine pattern. Heating portion 212 thus includes rings 216, 218, 220, 222 and 224, rings 216 and 218 being joined by connecting members 226a and 226b, rings 218 and 220 being joined by connecting members 228a and 228b, rings 220 and 222 being joined by connecting members 230a and 230b, and rings 222 and 224 being joined by connecting members 232a and 232b. Heating portion 214, on the other hand, has a smaller diameter than heating portion 212 and includes rings 236, 238, 240 and 242, with rings 236 and 238 being joined by connecting members 244a and 244b, rings 238 and 240 being connected by connecting members 246a and 246b, and rings 240 and 242 being joined by connecting members 248a and 248b. A pair of spacers 250 and 252 maintain heating portion 214 at a spaced distance from heating portion 212 and are typically formed from the same material as these heating portions. In attaching heating element 210 to the surface of diffuser plate 192, the concentric rings and connecting members forming heating portions 212 and 214 are positioned between apertures 194 in such manner that heating element 210 will not interfere with the outwardly flow of vapors from flux box assembly 180. That is, the inner rings 216 and 236 of heating portions 212 and 214, respectively, are aligned with one another and interposed in the space between the innermost band of apertures 196 and the next band of apertures 198. The next rings 218 and 238 of heating portions 212 and 214, respectively, are also aligned with one another and interposed in the space between aperture bands 198 and 200. The connecting members 226a and 226b which connect the innermost ring 216 to the adjacent ring 218 on heating portion 212 and the connecting members 244a and 244b which connect the innermost ring 236 to the adjacent ring 238 on heating portion 214 are positioned to lie in alignment with those regions in which the circular sequence of apertures in band 198 is interrupted. In other words, connecting members 226a and 244a overlie an area 260 of diffuser plate 192 having no apertures, and connecting members 226b and 244b overlie a similar area 262 of diffuser plate 192. The same is true for each succeeding ring on heating portions 212 and 214 and the connecting members therebetween. Thus, rings 220 and 240 are aligned with one another and interposed in the space between aperture bands 200 and 202, while connecting members 228a and 246a and connecting members 228b and 246b, respectively, are aligned with one another and overlie regions 264 and 266 in which there is a discontinuity in the sequence of apertures in band 200; rings 222 and 242 are aligned with one another and interposed in the space between aperture bands 202 and 204, while connecting members 230a and 248a and connecting members 230b and 248b, respectively, are aligned with one another and positioned in regions 268 and 270 in which there is a discontinuity in the sequential apertures in band 202; and outermost ring 224 on heating portion 212 is positioned outwardly of the outermost aperture band 204, while connecting member 232a and lead member 280 and connecting member 232b and lead member 282, respectively, are aligned with one another and overlie the regions 272 and 274 of diffuser plate 192 having no apertures. A pair of posts 284 and 286 which are electrically connected to heating portions 212 and 214 protrude through diffuser plate 192 and serve as terminals for supplying current to resistance heating element 210 through electrical leads 288 and 290 which are connected through vacuum-tight electrical feedthroughs 292 and 294 (FIG. 1) to a power source (not shown).

As will be discussed in more detail below, in performing the coating process in accordance with the present invention, flux box assembly 180 will be subjected to the corrosive properties of the source material vapors as well as the extremely high temperatures required to maintain the source materials in a vapor state as they flow into body 182 and outwardly through diffuser plate 192 toward wafer W.

Accordingly, body 182 and diffuser plate 192 must be formed from a material which is chemically resistant and capable of withstanding these high temperatures, yet which has sufficient mechanical strength and minimal thermal expansion so that it will not deteriorate upon repeated processing cycles. One preferred material in this regard is boron nitride, although other materials may be employed which have suitable properties for withstanding these difficult conditions.

As noted above, apertures 188 and 190 in body 182 of flux box assembly 180 each serve as an inlet for a vaporized source material. The source materials themselves may consist of solid elemental materials, such as arsenic, gallium, germanium, cadmium and other such solid elemental materials; liquid source materials such as triethylgallium (TEGa), tetramethylgermanium (TTMGe), triethylsilane (TESi), monoethylarsenic (MEAs) and other metallorganic materials; and gaseous source materials such as arsine, phosphine, silane and others. Solid elemental source materials, however, enable the advantages of the present invention to be realized to their fullest extent.

In the case of a solid elemental source material, a vapor thereof is supplied to flux box assembly 180 by first heating the source material to a specified vaporization temperature. This is accomplished by placing a quantity of the solid elemental source material into a furnace which is connected in communication with flux box assembly 180. Depending on the temperature required to obtain a sufficiently high vapor pressure of the elemental source material to be deposited, the vaporizing furnace therefor may be located either exterior of reaction chamber 100 or in the interior thereof in order to shorten the distance the vapors have to travel to reach flux box assembly 180. For elemental source materials having a high vapor pressure, such as, for instance, arsenic, the vaporizing furnace is preferably located exterior of reaction chamber 100. In this configuration, which can be seen in FIG. 4, the periphery of an aperture in reaction chamber 100 is provided with a cylindrical input tube 302. This input tube 302 includes an annular flange 304, and can thus be enclosed by an end plate 306 to form a vacuum-tight seal. A furnace 310 having a heating element 312 coiled thereabout is connected to one end of a transport tube 314 which then passes through end plate 306 in a known manner to maintain the vacuum-tight integrity of reaction chamber 100 and connects to a recess 315 which is formed in flux box body 182 concentrically with inlet aperture 188. Transport tube 314 may be heated by a coiled heating element 316 in order to maintain the source material in a vaporized state as it travels from oven 310 to flux box assembly 180. When this is done, transport tube 314 will typically be heated to a higher temperature than furnace 310 to prevent the source material vapor from condensing as it travels therethrough. An adjustable needle valve 318 positioned near the exit of furnace 310 includes an adjustment knob 318a for regulating the rate at which the vaporized source material flows to flux box assembly 180 from furnace 310. Optionally, an inert carrier gas, such as hydrogen, may be supplied through a mass flow controller (not shown) to the inlet 310a of furnace 310 to facilitate and control the flow of the vaporized source material into flux box assembly 180 and then out therefrom towards wafer W. If desired, the inert carrier gas may be preheated prior to entering furnace 310. One method of accomplishing this would be to coil the supply conduit for the carrier gas around furnace 310 so that the carrier gas will be heated prior to entering the furnace.

Figure 4:
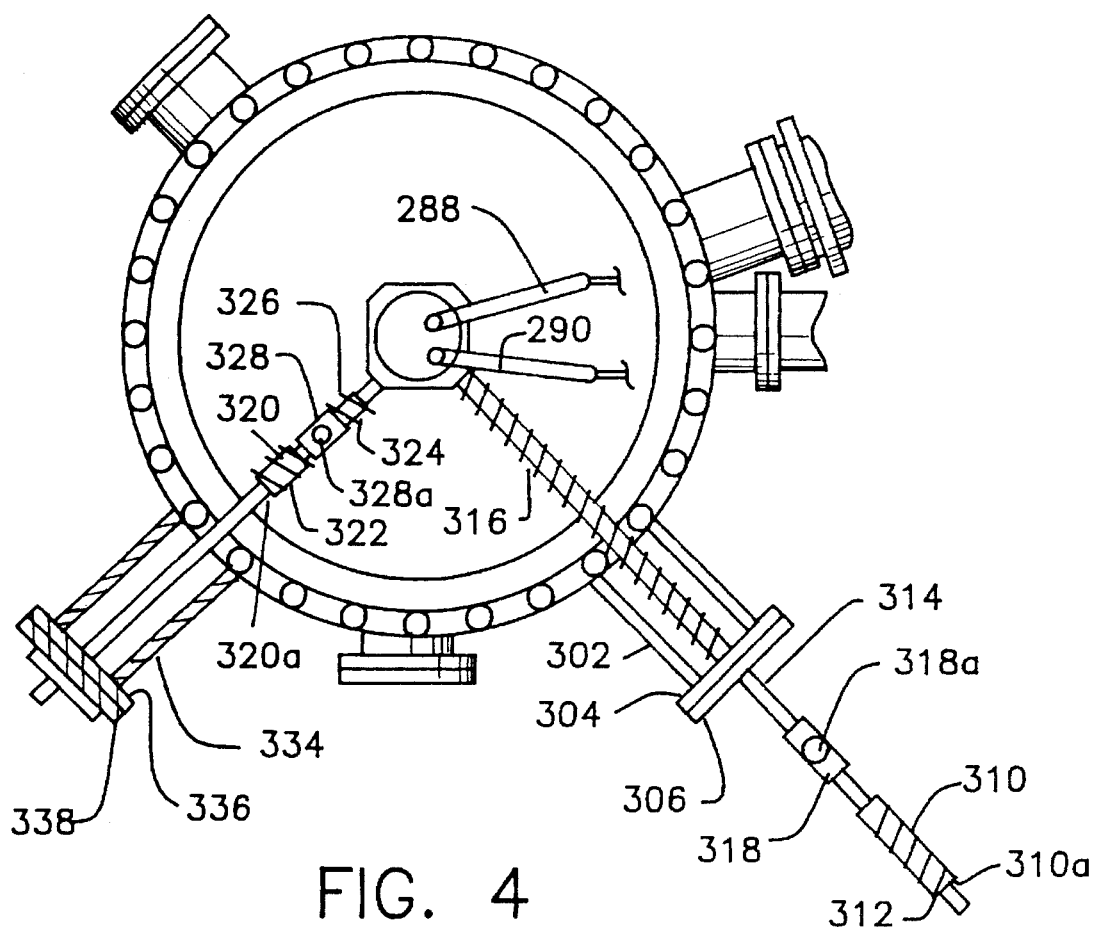
FIG. 4 is a top plan view of the coating apparatus of FIG. 1 with the top portion removed to show the interior thereof.
Figure 3A:
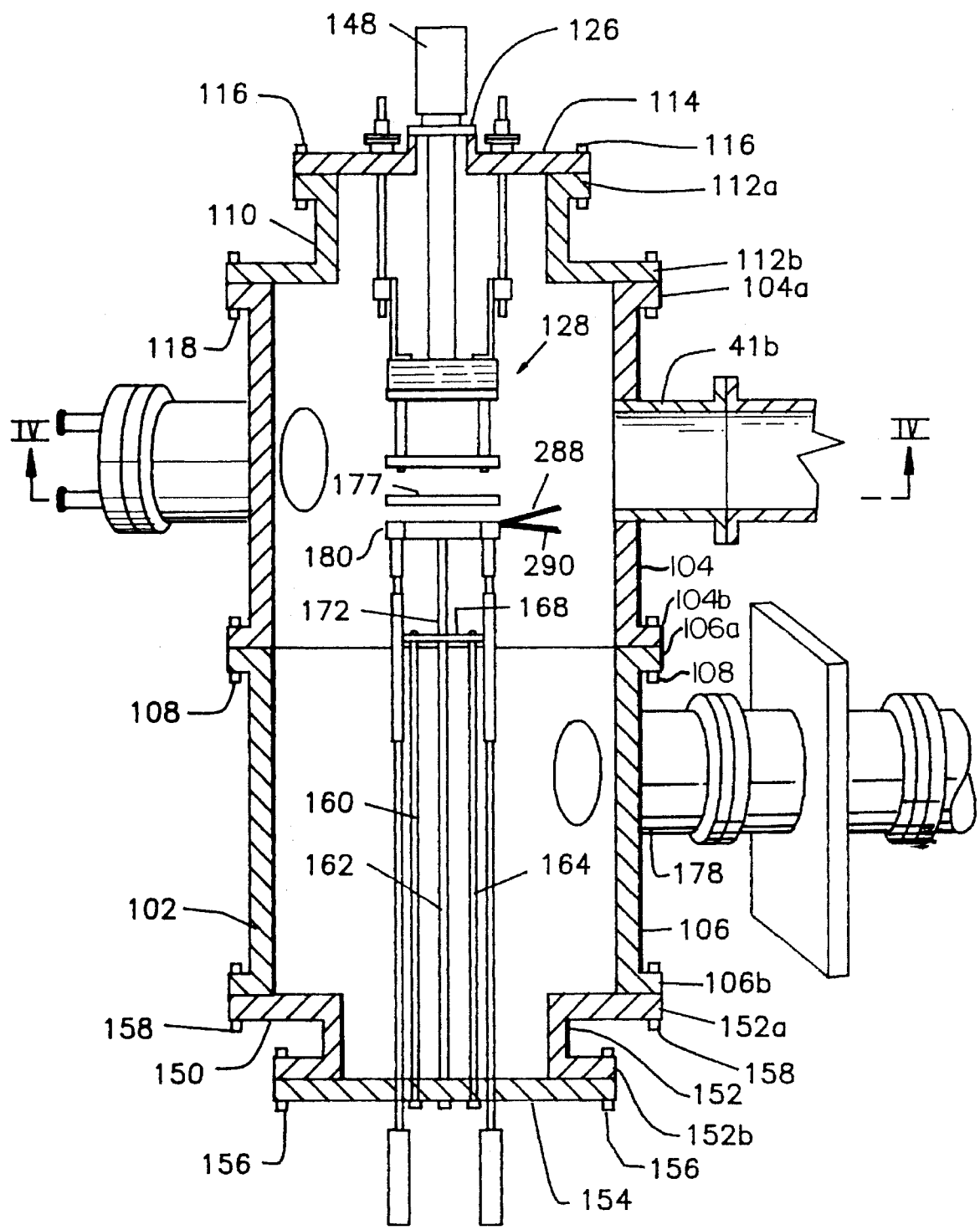
FIG. 3a is a sectional view taken along line III—III of FIG. 2.
Figure 3B:
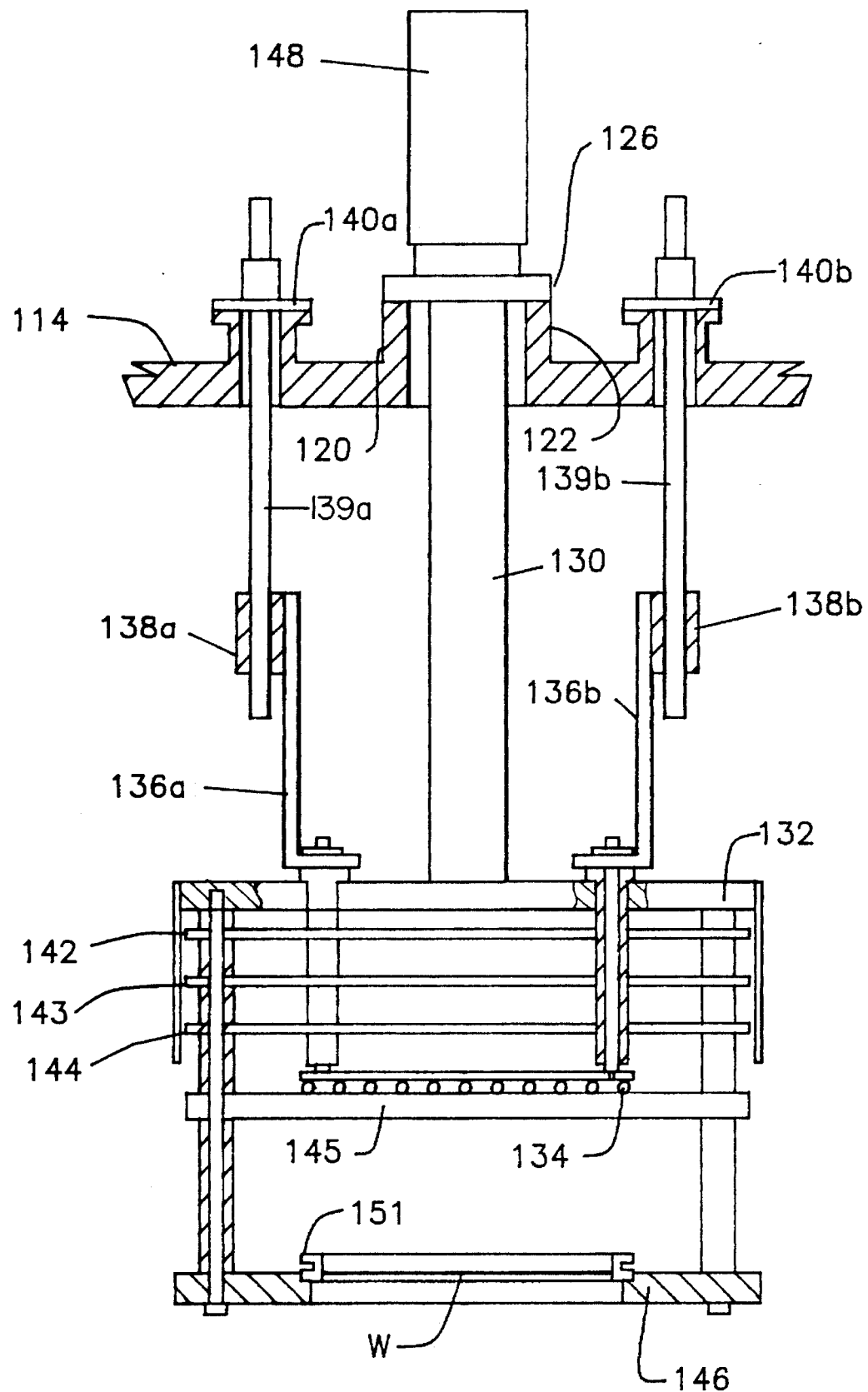
FIG. 3b is a front elevational view of the wafer support and positioning mechanism of the present invention.

The vaporizing furnace is preferably located within reaction chamber 100 for elemental source materials having a low vapor pressure, such as gallium, to thereby shorten the distance the vaporized source material has to travel to reach flux box assembly 180. Such arrangement is also shown in FIG. 4 where furnace 320 having heating element 322 coiled thereabout is disposed within reaction chamber 100. A shortened transport tube 324 heated by coiled heating element 326 connects furnace 320 to a recess 327 formed concentrically with inlet aperture 190 in flux box body 182. An adjustable needle valve 328 is disposed between furnace 320 and the inlet to flux box body 182. Needle valve 328 includes a shaft 328a which extends upwardly and connects to one portion of a conventional linear motion feedthrough 330 provided in upper closure member 110 (FIG. 1). An adjustment knob 328b connected to the other portion of linear motion feedthrough 330 enables needle valve 328 to be rotated to adjust the flow of the vaporized source material from furnace 320 to flux box assembly 180. Again, a source of an inert carrier gas may be supplied through a mass flow controller (not shown) to the inlet 320a of furnace 320. To enable such arrangement, a cylindrical input tube 334 having an annular flange 336 is connected coextensively with an aperture in reaction chamber 100. An end plate 338 forms a vacuum-tight enclosure on cylindrical input tube 334. The carrier gas flowing from the mass flow controller to the inlet 320a of furnace 320 passes through end plate 338 in a known fashion which maintains the vacuum-tight integrity of reaction chamber 100. Once again, the carrier gas may be preheated prior to entering furnace 320.

Figure 13:
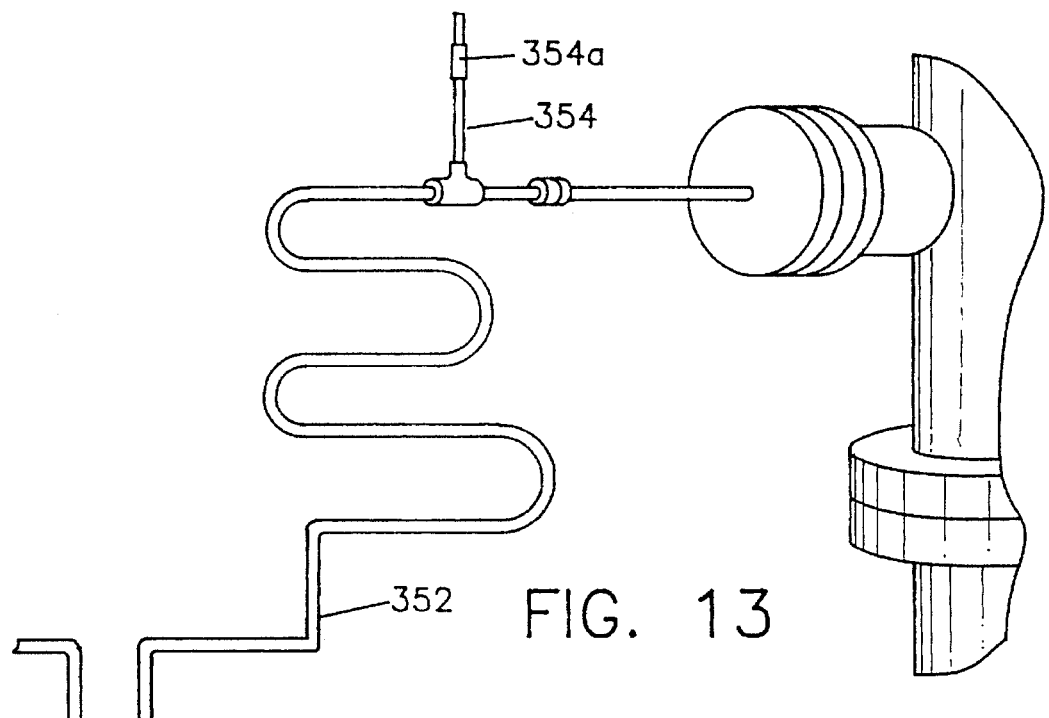
FIG. 13 is a partial elevational view showing a feed arrangement for a liquid or a gaseous source material.
Figure 12:
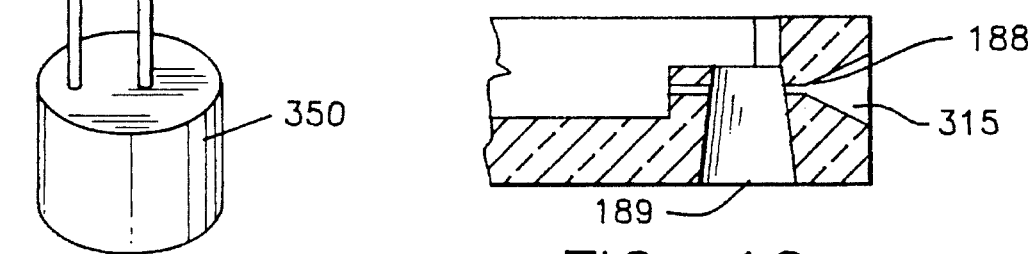
Figure 11A:
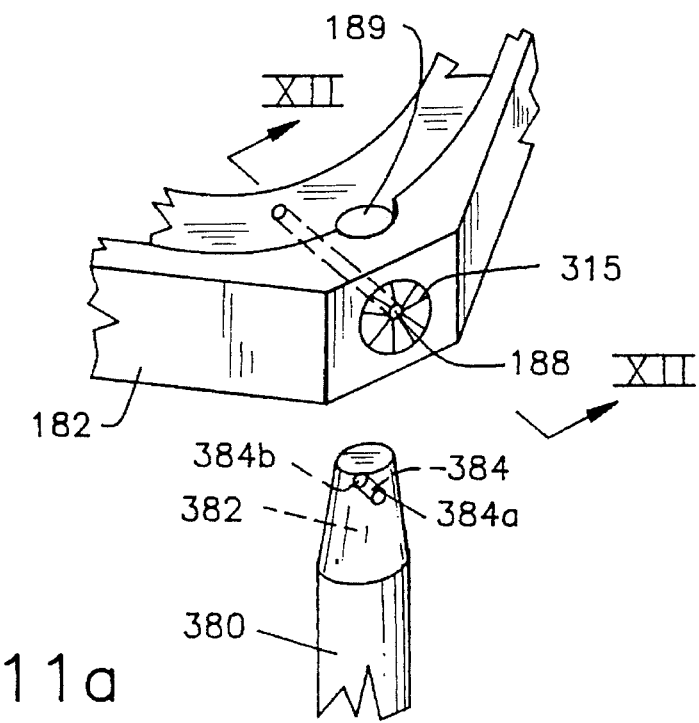
FIG. 11a is an exploded partial perspective view of the flux box shut-off valve.

In those instances when a liquid source material is to be used in conjunction with the process and apparatus of the present invention, a vapor is produced therefrom by passing an inert carrier gas, such as hydrogen, through a bubbling apparatus 350, the structure and operation of which is well known in the art. As shown in FIG. 13, the output vapor from bubbling apparatus 350 travels in a transport tube 352 through an input to reaction chamber 100 having a construction which is essentially the same as cylindrical input tube 334 and then to an inlet aperture in flux box assembly 180. Transport tube 352 includes an adjustable needle valve 354 having an adjustment knob 354a for regulating the vapor flow rate therethrough. If the vapor pressure of the liquid source material is sufficient (as with TESi, TTMGe, MEAs, etc.) bubbling is not required and the vapor pressure of the source material will drive the mass transport. In such case, a mass flow controller (not shown) can be employed between the liquid source material and the reaction chamber 100 to regulate the source vapor flow.

In the event gaseous source materials are used, the system for supplying the gas to flux box assembly 180 will be essentially the same as the system described above in connection with liquid source materials, except that the bubbler 350 is replaced with a source of the gaseous material. Although not required in such system, an inert carrier gas may be supplied through a mass flow controller if, for instance, dilution of the gaseous source material is desired.

Figure 5:
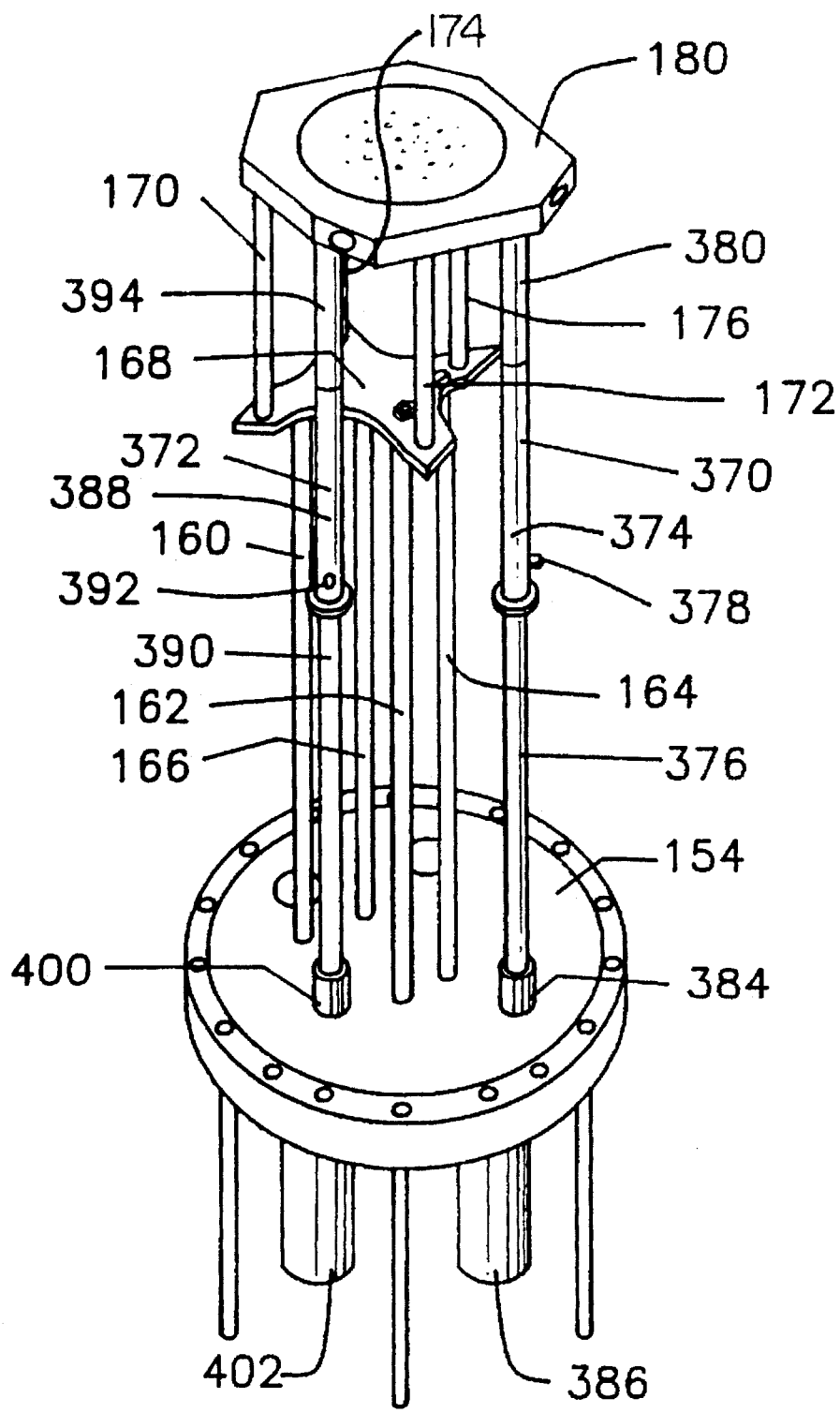
FIG. 5 is a perspective view of the flux box assembly of the present invention and the supporting structure therefor.
Figure 6:
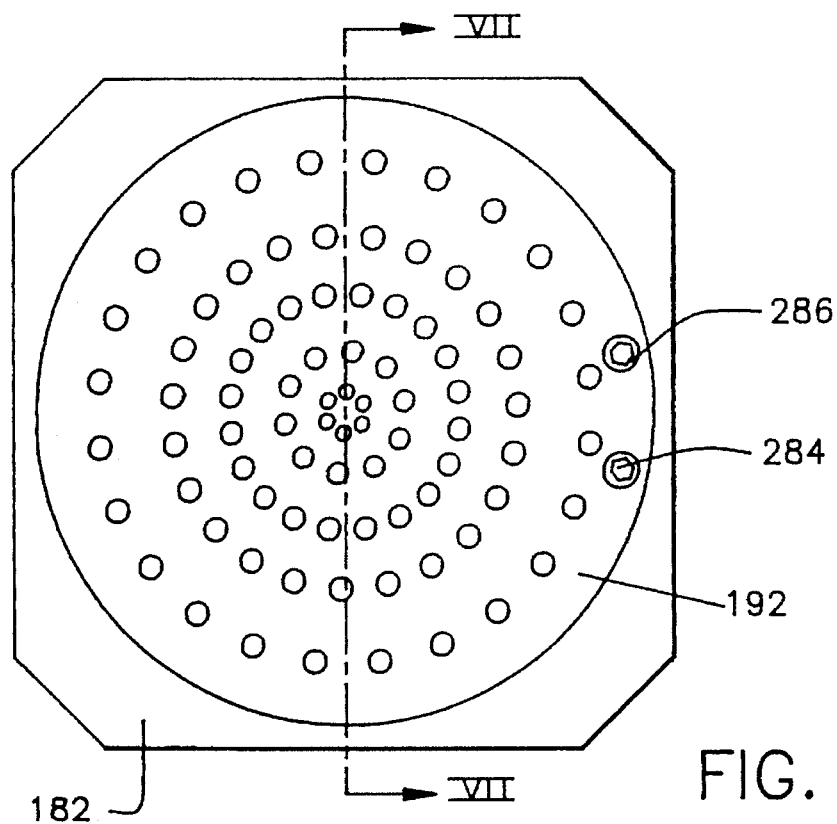
FIG. 6 is a top plan view of the flux box assembly of the present invention.
Figure 7:
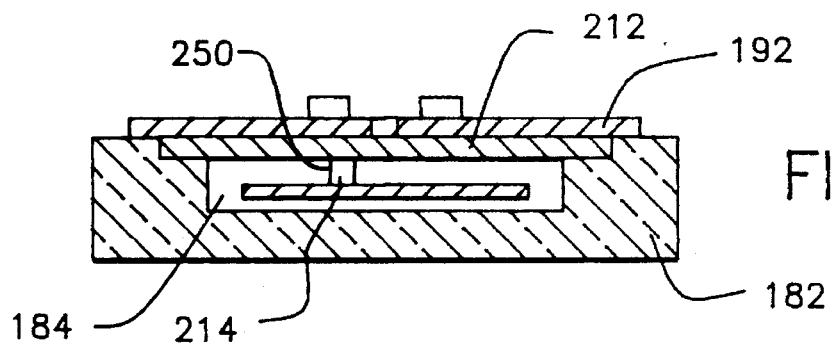
FIG. 7 is a sectional view taken along line VII—VII of FIG. 6.
Figure 8:
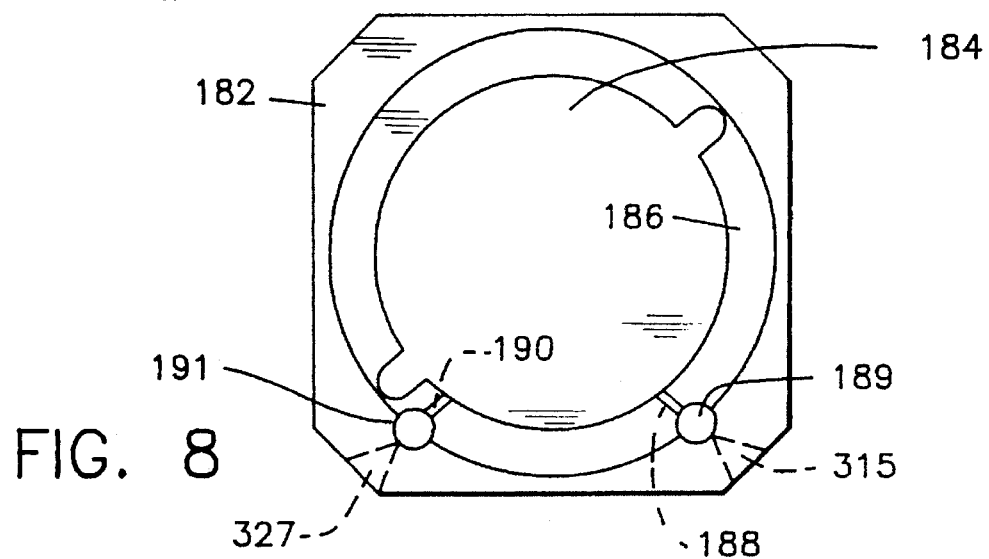
FIG. 8 is a top plan view of the flux box assembly of FIG. 6 with the flux box diffuser plate removed therefrom.
Figure 9:
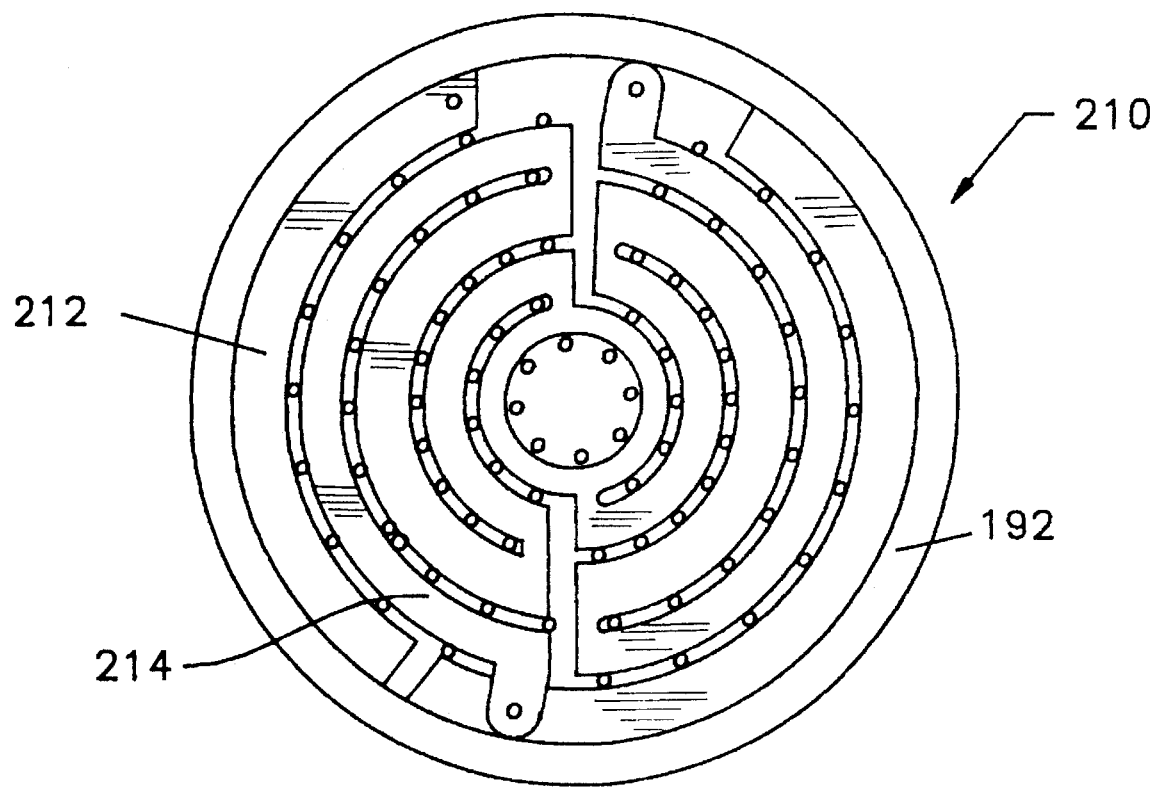
FIG. 9 is a bottom plan view of the flux box diffuser plate and the heating elements associated therewith.
Figure 10:
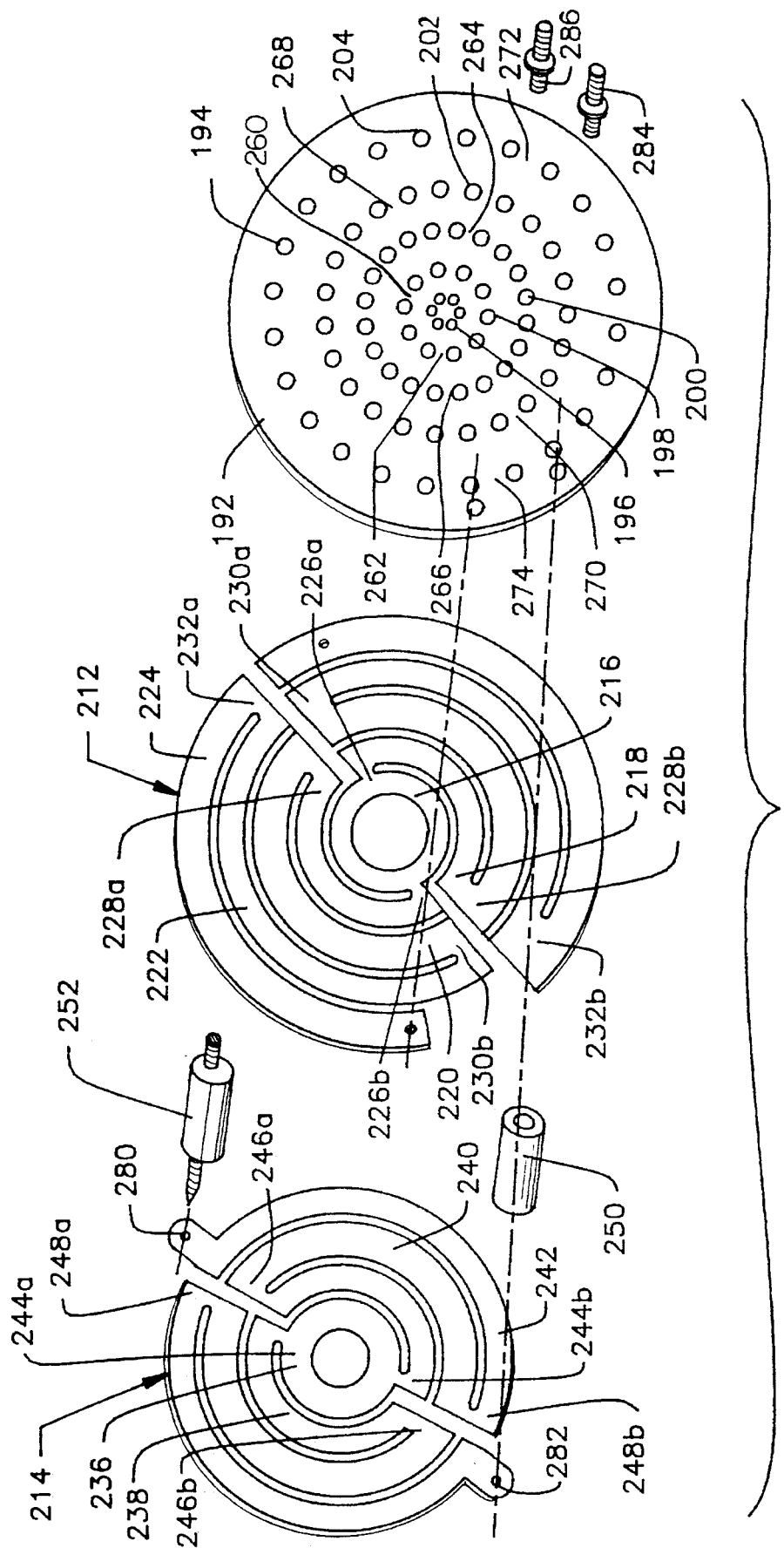
FIG. 10 is an exploded perspective view showing the assembly of the flux box diffuser plate and the heating elements associated therewith.

Each inlet aperture to flux box body 182 is provided with a shut-off valve in order to substantially stop the flow of source material vapors into cavity 184. Two such shut-off valves 370 and 372 are shown in FIG. 5. Shut-off valve 370 includes a tubular member 374, one end of which telescopically receives one end of a shaft 376 which is fixedly connected thereto by set screw 378. The other end of tubular member 374 includes a valve member 380 having a conically-shaped tip portion 382 which is rotatably seated in conically-shaped hole 189, all of which can be seen in FIG. 11a. Tip portion 382 includes a transverse aperture 384 having ends 384a and 384b which may be aligned with inlet aperture 188 to provide an uninterrupted vapor flow path from transport tube 314 to cavity 184 in flux box body 182. Rotating shut-off valve 370 so that the ends of transverse aperture 384 are no longer aligned with inlet aperture 188 will occlude this vapor flow path and thus substantially terminate the flow of vapors into flux box body 182 from transport tube 314. The flow to flux body 182 can be reduced, but not terminated, by partially misaligning apertures 188 and 384.

The end of shaft 376 remote from tubular member 374 is connected to one portion of a conventional rotary motion feedthrough 384 on the side of lower wall member 154 facing the interior of reaction chamber 100. An operating knob 386 connected to the other portion of rotary motion feedthrough 384 on the opposite side of lower wall member 154 (and thus exterior of reaction chamber 100) may be manipulated by rotating either manually or by use of a motor or some other remote control device to thus control the flow through inlet aperture 188.

The shut-off valve 372 associated with inlet aperture 190 operates in substantially the same manner as shut-off valve 370 to control the flow of vapors from conduit 324 to the interior of flux box body 182. Thus, shut-off valve 372 includes a tubular member 388 which telescopically receives at one end thereof a shaft 390 fixedly connected thereto by set screw 392. At its other end, tubular member 388 includes a valve member 394 having a conically-shaped tip portion which is rotatably seated in conically-shaped hole 191. This tip portion also has a transverse aperture the ends of which may be aligned with inlet aperture 190 to thus provide an uninterrupted vapor flow path from transport tube 324 to the interior of flux box body 182. As shut-off valve 372 is rotated so that the ends of its transverse aperture are not aligned with inlet aperture 190, this vapor flow path will be occluded and, hence, the flow of vapors into flux box body 182 from transport tube 324 will be substantially terminated. At its end remote from tubular member 388, shaft 390 is also connected to a rotary motion feedthrough 400 arranged on lower wall member 154. On the exterior of reaction chamber 100, rotary motion feedthrough 400 includes an operating knob 402, the rotation of which will adjust the opening through inlet aperture 190. Valve members 380 and 394 are preferably formed from the same material as flux box body 182 (preferably boron nitride) or a chemically inert material having a substantially Similar coefficient of thermal expansion as the material forming flux box body 182, thereby ensuring that these valve members will remain operable in their respective holes even under the corrosive and extremely high temperature conditions at which the flux box assembly 180 operates.

An alternate embodiment of valves 370 and 372 is shown in FIG. 11b. In this embodiment, the tip portion 382 of valve member 380 is cylindrical rather than conical and includes two apertures 385 and 387 in addition to aperture 384. Aperture 385 extends at a right angle in tip portion 382 between a first end 385a which is radially aligned below end 384a of aperture 384 and a second end 385b. Aperture 387 extends from an end 387b which is radially aligned below end 384b of aperture 384 to a bore 389 which extends axially through the interior of tubular member 374 and shaft 376 where it connects to an inert gas supply (not shown). The end of shaft 376 remote from tubular member 374 is connected in this embodiment to a conventional feedthrough which permits both rotary motion and linear motion through lower wall member 154 while maintaining the vacuum conditions within reaction chamber 100.

By selectively maneuvering valve member 380 to a desired position, valve 370 can be placed in either a "run" mode, a "vent" mode, or a "purge" mode. In the run mode, valve member 380 will be in essentially the same position as in the operating mode described above in connection with the embodiment of FIG. 11a. That is, in the run mode, the ends 384a and 384b of transverse aperture 384 will be aligned with inlet aperture 188, thereby providing an uninterrupted vapor flow path from transport tube 314 to cavity 184 in the interior of flux box body 182. Without rotating same, valve member 380 may be raised until end 385a of aperture 385 is in alignment with inlet aperture 188, thereby placing valve 370 in the vent mode. In this position, end 385b of aperture 385 will be aligned with aperture 391 in flux box body 182 to provide a flow path for the source material vapors from transport tube 314 through flux box body 182 and directly out therefrom into reaction chamber 100 where they can be exhausted. Thus, in the vent mode, the source material vapors never enter cavity 184 and are therefore never directed for deposition on wafer W. Further movement of valve member 380 in the linear direction without rotation will place valve 370 in the purge mode in which end 387b of aperture 387 is aligned with inlet aperture 188. This position will create a flow path from the inert gas supply directly to cavity 184 so that a flow of the carrier gas can be used to flush remnants of the previous source material vapor from cavity 184, thus enabling a different source material vapor to be introduced thereto without becoming contaminated.

Returning to reaction chamber 100, there is connected thereto an assembly 410, shown in FIG. 1, for receiving wafers W and transferring same to the wafer support and positioning mechanism 128 for processing. Thus, assembly 410 includes a load lock chamber 412 of a type generally known in the art into which a single wafer or a cassette of wafers may be loaded. Load lock chamber 412 may include devices for cleaning and deoxidizing the wafers loaded therein. For example, load lock chamber 412 may include an Electron Cyclotron Resonance (ECR) unit for generating a hydrogen plasma which is directed at the wafers to deoxidize same. A transfer fork (not shown) traveling in tube 414 then transfers the cleaned and deoxidized wafers from load lock chamber 412 through gate valve 416 and cylindrical input tube 418 for loading on the susceptor 146 of wafer support and positioning mechanism 128.

Reaction chamber 100 may also include a number of other cylindrical input tubes for connecting various processing and testing apparatus in a vacuum-tight manner thereto. For example, such additional processing apparatus may include an additional ECR unit directed at the wafer W during the deposition process for lowering the deposition temperature. Testing apparatus may include, for example, thermocouples for measuring the temperature at various process locations within reaction chamber 100, Residual Gas Analyzers (RGAs) for measuring the composition of the process and exhaust gases; pressure sensors for detecting the pressure within reaction chamber 100, an X-ray diffraction unit for measuring the coating thickness and composition deposited on wafer W, etc.

Apparatus 10 is employed to deposit a defect-free layer on the surface of a wafer W. Depending on the composition to be deposited and the source materials therefor, apparatus 10 will be configured so that the vapors of the desired source materials are fed to flux box assembly 180 from one or more internal furnaces, external furnaces, bubbling apparatus and/ or gaseous sources. Although the combination of source materials which may be simultaneously deposited is not limited by the structure of apparatus 10, it will be appreciated that these source materials must be compatible with one another under the specific processing conditions being employed. For instance, solid elemental source materials may require that flux box assembly 180 operate at a relatively high temperature in order to maintain the source material in a vapor state. Such temperature, however, may be too high for a metallorganic or gaseous source material and may affect the chemical or other properties of such material. Accordingly, careful consideration must be given to selecting compatible source materials which will yield a coating of the desired composition. Each of these source material supplies may further be provided with an inert carrier gas to help control the flow of the source vapors to flux box assembly 180. Moreover, a carrier gas may be provided directly to flux box assembly 180 in order to dilute the concentration of the combined source material vapors flowing therefrom towards wafer W, and in order to purge flux box assembly 180 of any residual source material vapors when the composition of the deposited layer is to be changed.

In any event, apparatus 10 is configured with the source material supplies appropriate for a particular process. Before a wafer W is introduced therein, reaction chamber 100 will typically be subjected to a preliminary bakeout step in which it is heated under vacuum conditions at or above the anticipated processing temperature in order to assure that any contaminants or other high vapor pressure materials are volatilized before they can contaminate the processing system and any wafers W therein.

Subsequent to this preliminary bakeout procedure, a wafer W is prepared in accordance with degreasing and etching techniques which are conventional in the industry. A single wafer W or an entire cassette of degreased and etched wafers are then loaded into load lock chamber 412 where they may undergo further cleaning and deoxidizing processes. Once fully prepared, load lock chamber 412 is evacuated and gate valve 416 opened so that a single wafer W may be transferred through input tube 418 and loaded on susceptor 146 in reaction chamber 100. Gate valve 416 is then closed and reaction chamber 100 evacuated to a predetermined base vacuum. Flux box assembly 180 is brought to the required temperature for the process by adjusting the power supplied to heating element 210. The temperatures and flow rates of the various source materials, carrier gases and transport tubes are then adjusted as needed until the flow of each source material has been stabilized at a desired flow rate. In addition, heating element 134 is operated in order to heat the wafer W to a desired temperature. Typically, each successive element in the flow path of the source materials is heated to a higher temperature than the previous element in order to prevent any of the source materials from condensing as they travel through the system. In other words, the temperature of each transport tube will generally be higher than the temperature at which its associated source material vapor has been generated, while the temperature of flux box assembly 180 will typically be higher than that of the transport tubes.

As the vapors from the various source materials enter flux box assembly 180 through inlet apertures, such as apertures 188 and 190, they will collide with the heated walls forming cavity 184 in the body 182 of flux box assembly 180. These collisions cause the volatilization of any microscopic droplets of source material which may be extant in cavity 184 before they are able to pass through diffuser plate 192 for deposition on wafer W. Additionally, depending on the temperature at which flux box assembly 180 is operated, any source material vapors having organic components may be cracked or decomposed therein before passing through diffuser plate 192. This will obviate the decomposition of such vapors at the surface of wafer W and eliminate any surface defects which may result therefrom.

In practice, it has been found that combining metallorganic and elemental sources is not practical for all chemistries. In the case of using elemental and metallorganic sources, a preferred embodiment is where solely metallorganic sources are used in a given flux box where they may or may not be predecomposed—preferably not. Further, if elemental and metallorganic sources are used in combination, then they may be introduced through separate flux boxes.

Once the various flow rates and temperatures in the system have reached equilibrium, the substrate shutter 177 is opened, thereby permitting the combined source vapors flowing from flux box assembly 180 to flow towards wafer W. In view of the low pressure in reaction chamber 100 (on the order of $10^{-5}$ Torr), the source vapors exiting flux box assembly 180 exhibit molecular flow characteristics. As a result of the pressure differential between flux box assembly 180 and reaction chamber 100, there is little likelihood that molecules of the source materials will combine into droplets in reaction chamber 100 prior to their deposition on wafer W.

The rate at which the materials are deposited on the surface of wafer W can be adjusted during the deposition process in several ways, as determined from the relationships governing the flux through an aperture. (These relationships are set forth in a simplified form in Product and Vacuum Technology Reference Book, "Vacuum Technology: Its Foundations, Formulae and Tables", Leybold, Inc. (1990). These simplified formulations do not necessarily take into account the true tortuous path traversed by the vapor.) Firstly, for source materials which do not employ a carrier gas, the flow is driven by the vapor pressure of the source material (Pm) and the conductance (k) of the aperture through the shut-off valve (such as valve 370 or 372). This relation is expressed as follows:

$$Nm = kPm$$

where Nm is the amount of material being transported. The value of Pm depends upon the temperature of the source material and is determined directly from vapor pressure tables for that material. The value of k can be determined experimentally by measuring the pressure drop across the shut-off valve, or may be calculated from the equation:

$$k = 11.6\, A$$

where A is the cross-sectional area of the aperture in centimeters. Thus, when no carrier gas is employed, the deposition rate of a source material may be controlled by adjusting the temperature of the source material to increase or decrease its vapor pressure, or by adjusting the opening of the shut-off valve for that material. For fixed aperture devices, this thermal control method is objectionable, particularly for the deposition of multilayer structures, because it has a very slow response time which makes rapid changes in flow rate impossible. Variable aperture devices, however, are capable of responding much more rapidly, and for that reason are much preferred.

If apparatus 10 is configured to have an inert carrier gas supplied directly to flux box assembly 180, the flow rate of the carrier gas can be adjusted to either increase or decrease the concentration of the source material vapors in flux box assembly 180, resulting in a concomitant increase or decrease in the deposition rate. For those source materials in which a carrier gas is employed to facilitate the flow of the source material vapors towards the flux box assembly 180, the flow rate of the source material vapors may be expressed as follows:

$$Nm = Nc\, Pm/(Ps-Pm)$$

where Nc is the flow rate of the carrier gas as read from a gauge and Ps is the pressure in the source material vessel as also read from a gauge. The pressure in the source material vessel, Ps, is in turn dependent upon the conductance of the shut-off valve aperture, the net material transport and the downstream pressure Pr (as also read from a gauge) in the reaction chamber 100. (This analysis assumes that the pressure on the downstream side of the shut-off valve aperture is approximately the same as the pressure Pr in the reaction chamber) Thus, the pressure in the source material vessel, Ps, can be determined as follows:

$$Ps = (Nm+Nc+k\, Pr)/k$$

In view of the foregoing, the deposition rate of a source material employing a carrier gas can again be adjusted by those methods described above for the case where no carrier gas is employed, i.e. by adjusting the temperature and thus the vapor pressure of the source material and by adjusting the aperture through the shut-off valve. The deposition rate can additionally be adjusted by adjusting the flow rate of the carrier gas.

The various adjustments set forth above can also be used to change the proportion of the individual source materials in the layer deposited on wafer W. For example, in a process for depositing a coating consisting of two materials M1 and M2, the flow rates of the materials may be adjusted so that the deposited layer consists of 50% M1 and 50% M2. By adjusting shut-off valve 372 to restrict the flow of the vapor of material M2, the deposited layer may be adjusted to a composition of approximately 67% M1 and 33% M2. Other adjustments may be made to effect similar compositional changes. For instance, by varying the valve positions during the deposition process a compositionally graded layer may be formed. In an extreme case, a coating may be deposited with alternating layers of M1 and M2 by alternately opening and closing shut-off valves 370 and 372 as individual layers of the desired thickness of each material are formed. Sharp transitions between alternate layers can be developed by closing both of shut-off valves 370 and 372 (as well as the shut-off valves for any other source materials) and purging flux box assembly 180 with an inert carrier gas between the deposition of adjacent layers. This process will remove any residual vapors of source material M1 from the system before shut-off valve 372 is opened and vapors of source material M2 are deposited on the wafer W, etc.

When a coating of the desired thickness and composition has been deposited on the surface of wafer W, substrate shutter 177 and shut-off valves 370 and 372 are closed to prevent any further deposition from taking place. The flow of the various source material vapors is then gradually decreased and terminated by cooling down the source material furnaces and transport tubes and reducing the various flows of the carrier gases. Heating elements 210 and 134 can then be turned off to cool down flux box assembly 180 and to permit wafer W to cool to a low enough temperature to be removed from reaction chamber 100. To effect such removal, gate valve 416 is opened, wafer W transferred to load lock chamber 412 and gate valve 416 again closed. The wafer W may cool further in load lock chamber 412 before being removed entirely from the system.

The following examples illustrate certain features of the invention as described above. The pressures reported are as read on standard pressure gauges without the application of calibration factors. In practice, varying the parameters about those shown in the examples result in significantly varying deposition rates and film qualities.

EXAMPLE I

The apparatus of the present invention was configured as shown in FIG. 4, with an external furnace, such as furnace 310, and an internal furnace, such as furnace 320. The external furnace was provided with a mass of elemental arsenic, while a mass of elemental gallium was provided in the internal furnace. A gallium arsenide (GaAs) wafer was prepared for deposition in accordance with conventional techniques. Thus, the wafer was first degreased in an acetone boil followed by a rinse in a methanol-deionized water solution. The wafer was then etched at room temperature in a $10:1:1$ $H_2SO_4$: $H_2O_2$: $H_2O$ mixture for 15 seconds, quenched in deionized water and spun dry. After this cleaning process, the wafer was loaded into the load lock chamber and purged with hydrogen for about 10 minutes at a pressure of about 5 Torr. The load lock chamber was then evacuated and a gate valve opened to permit the wafer to be transferred to the wafer support and positioning mechanism.

Following the closure of the gate valve, the reaction chamber was evacuated to a base vacuum of about $8\times10^{-8}$ Torr. The external furnace was then turned on and heated to a temperature of about 425° C. to generate arsenic vapors, while its associated transport tube was heated to a temperature of about 445° C. As a result of the pressure difference between the reaction chamber and the external furnace, the arsenic vapors were caused to flow towards the flux box assembly. After a period of about one hour, this flow began to stabilize at a rate of about 5 sccm (standard cubic centimeters/minute). This flow rate was not measured, but was calculated from the vapor pressure of arsenic and the physical parameters of the system. The pressure in the reaction chamber increased to about $7\times10^{-6}$ Torr at the time stable arsenic flow had been achieved.

Subsequently, the substrate heater was turned on and adjusted to provide a wafer temperature of about 550° C. The substrate shutter was then closed and the internal furnace was turned on and heated to a temperature of about 1210° C. to generate gallium vapors, while its associated transport tube was heated to a temperature of about 1235° C. and the flux box assembly was heated to a temperature of about 1245° C. Once the flow of gallium vapors had stabilized at about 0.5 sccm, the substrate shutter was opened. At this point, the pressure in the reaction chamber was about $2\times10^5$ Torr.

With the substrate shutter and the shut-off valves in the flux box assembly open, the gallium and arsenic vapors flowed into the flux box body, colliding with the walls thereof and then out through the flux box diffuser plate. These combined vapors were deposited on the GaAs wafer at a rate of about 1.3 microns per hour. It is believed that the gallium and arsenic were deposited on the wafer in their elemental form, and not as molecules of gallium arsenide.

Without being held to any particular theory, this conclusion is based on the small probability that the gallium and arsenic molecules will collide with one another because of the relatively large volume of the cavity in the flux box body, and the fact that any gallium arsenide molecules which do form in the flux box assembly will disassociate as they strike the surface of the flux box assembly which is operating at a very high temperature.

The deposition process was continued until a layer having an average thickness of about 6.3 microns was obtained. At this point, the substrate shutter was closed and the internal furnace and heating element for its associated transport tube were turned off, thereby allowing the gallium source material to cool down. The wafer, however, was kept at an elevated temperature, as was the external furnace and arsenic transport tube so as to maintain a relatively constant flow of arsenic vapor. This constant flow of arsenic vapor provided a background arsenic pressure in the reaction chamber which served to retard the evaporation of arsenic from the wafer coating. Once the gallium source temperature dropped to less than about 700° C., the external furnace and the heating element for the arsenic transport were turned off to permit the arsenic source material to cool. When the temperature of the arsenic source material had dropped below about 100° C., the gate valve was opened, the wafer was transferred to the load lock chamber and the gate valve was again closed. The load lock chamber was then purged twice by hydrogen gas to flush out any toxic materials and to help cool the coated wafer, which was then removed from the apparatus. The GaAs layer deposited by this process exhibited an extraordinarily "clean" surface morphology without oval defects.

EXAMPLE II

The procedure described above in connection with the Example I was followed except that a mass flow controller was employed to introduce a hydrogen carrier gas through the arsenic source at a flow rate of about 1–3 sccm. In this range, the molecular hydrogen flow does not significantly affect the surface morphology of the deposited layer or the deposition rate.

Deposition was conducted at a rate of about 1.75 microns per hour, during which time the pressure in the reaction chamber was about $1 \times 10^{-4}$ Torr. After a period of about one hour, a surface layer having an average thickness of about 1.75 microns was obtained. The deposition process was then terminated and the apparatus cooled in substantially the same manner as described above in connection with Example I. That is, the substrate shutter was closed and the internal furnace and its associated transport tube were turned off, permitting the gallium source material to cool down to a temperature of about 700° C. During this time, the wafer was held at a temperature of about 550° C. and the external furnace was held at a temperature of about 420° C. with a hydrogen flow of about 1 sccm therethrough. When the gallium source had cooled to about 700° C., the external furnace and its associated transport tube were cooled and the hydrogen flow terminated. The apparatus was further cooled and the wafer unloaded therefrom as described previously. This process yielded a deposited layer which was essentially the same as that obtained in Example I. That is, a good surface morphology without oval defects was obtained.

EXAMPLE III

A silicon wafer was cleaned in the same manner as described above for Example I. Liquid tetramethylgermanium (TTMGe) was placed in the cannister of a bubbler and cooled to a temperature of about 0° C. Liquid triethylsilane (TESi) was placed in the cannister of another bubbler and cooled to a temperature of about 5° C. Since these liquid materials were cooled to less than room temperature, there was no need to heat the transfer tubes between the bubblers and the flux box assembly, which itself was heated to 500° C. The substrate heater was then adjusted to heat the wafer to a temperature of about 750° C. Subsequently, the flow rate of the TTMGe was adjusted by a mass flow controller to a rate of about 0.75 sccm; the flow rate of TESi was adjusted in a similar fashion to a rate of about 2.0 sccm; and the flow rate of the hydrogen was similarly adjusted to a rate of about 3.0 sccm. At these flow rates, the pressure in the reaction chamber increased to about 1.0 Torr.

The substrate shutter was then opened to deposit a SiGeC layer on the wafer surface at a rate of about 2.6 microns per hour. When the desired coating thickness of about 2.6 microns was obtained, the substrate shutter was closed, each of the mass flow controllers was set to zero flow and shut-off valves in each of the three vapor transport lines were closed. The flux box and substrate heaters were turned off when the pressure in the reaction chamber reached about $1 \times 10^{-6}$ Torr. When the flux box and wafer temperatures fell below 100° C., the wafer was removed from the reaction chamber as described in Example I.

EXAMPLE IV

The process described above in connection with Example III was followed, with the exception that the bubbler cannisters were filled with liquid triethylgallium (TEGa) and monoethylarsenic (MEAs), respectively. Since the room temperature vapor pressure of TEGa is about 6.8 Torr and the room temperature vapor pressure of MEAs is about 57 Torr, a sufficient vapor flow of these materials was generated at room temperature without the need to heat the bubblers, flux box assembly and transfer tubes therebetween. The substrate was heated to a temperature of about 500° C. which, through radiation, heated the flux box assembly to a temperature of about 225° C. This temperature is insufficient for TEGa and MEAs cracking. Using mass flow controllers, the flow rate of TEGa was adjusted to about 0.25 sccm and the flow rate of MEAs was adjusted to about 2.5 sccm.

With their respective shut-off valves open, these metallorganic source materials flowed through the flux box assembly to deposit a GaAs layer on the GaAs wafer at a rate of about 7 microns per hour. When the desired coating thickness of about 3.5 microns had been obtained, the shut-off valve in the TEGa transport line was closed and the substrate cooled to room temperature while maintaining flow through the MEAs transport tube. The shut-off valve in this transport tube was subsequently closed. Again, the coated wafer exhibited a good surface morphology, with a room temperature electron concentration of about $2 \times 10^{16}$ cm$^{-3}$ and a mobility of about 3000 cm$^2$/Vs.

The superior results obtainable with the elemental vapor transport process of the present invention may be achieved in conventional molecular beam and chemical beam epitaxy systems by merely replacing the effusion cell sources of these systems with source cells embodying the principles of the present invention. Referring to FIG. 14a, a source cell 700 is constructed so as to be easily retrofitted to a conventional epitaxy unit as a replacement for the effusion cells therein. Source cell 700 includes a base plate 710 which carries the various elements required to generate a vapor of an elemental source material and which is adapted to be bolted or otherwise connected to the process chamber of an epitaxy unit. Thus, base plate 710 includes a support structure comprising a lower support cylinder 712, typically formed from stainless steel, and an upper support cylinder 714, typically formed from a refractory metal such as tantalum or molybdenum, which, in turn, supports a crucible 716 containing a solid or liquid source material 718. Both crucible 716 and the source material 718 therein are heated by a lower level heater 720 to thereby generate a vapor of the source material which passes through an upper portion of crucible 716 where it can be heated by an upper level heater 722. Lower level heater 720 may consist of a conductive wire coiled around the lower periphery of crucible 716 and connected to a power source through electrical leads 724 and 726. Similarly, upper level heater 722 may consist of a conductive wire coiled around the upper periphery of crucible 716 and connected through electrical leads 728 and 730 to a power source. Alternatively, lower level heater 720 and upper level heater 722 may comprise a single heating element which is graded to provide a hotter temperature at the top of crucible 716 than at the bottom thereof. That is, upper level heater 722 may have more loops around crucible 716 per linear inch of crucible 716 than does lower level heater 720.

The opening of crucible 716 is enclosed by a diffuser plate 732 having a plurality of apertures 733 which permit the source vapor to pass therethrough. An outer cylindrical flux distribution member 734 is assembled over diffuser plate 732, extending downwardly around upper support cylinder 714, and is held in place by a pair of retaining clamps 736 and 738 which are connected at their lower ends to base plate 710 by spring loaded tension bolt assemblies 740 and 742, respectively. Optionally, retaining clamps 736 and 738 may be replaced by a single cylindrical retaining clamp which is connected by a plurality of tension bolt assemblies to base plate 710, thus forming a shroud or enclosure which surrounds source cell 700. Flux distribution member 734 includes a plurality of apertures 735 which are in deliberate misalignment with the apertures 733 in diffuser plate 732. A spaced distance is maintained between flux distribution member 734 and diffuser plate 732 by an annular ring spacer 744.

Crucible 716, diffuser plate 732 and annular ring spacer 744 are all preferably formed from a material which will not outgas, which is otherwise capable of withstanding the high temperature and vacuum conditions under which source cell 700 operates, and which will not react under those conditions with the particular source materials being used. Particularly desirable materials in that regard include pyrolitic graphite, pyrolitic boron nitride, refractory metals such as tantalum and molybdenum, and combinations of these materials, although other materials having similar properties are contemplated. The most desirable material for forming these components will depend upon the particular source material and operating conditions employed in a given process.

Flux distribution member 734 includes a heating element 746 which heats both the apertured portion 734a and the cylindrical portion 734b thereof. Preferably, flux distribution member 734 is formed from a pyrolitic boron nitride-pyrolitic graphite-pyrolitic boron nitride sandwich material such as is available from Union Carbide. Briefly, flux distribution member 734 is formed by depositing a layer of pyrolitic boron nitride on a cylindrical mandrel, followed by a thin layer of pyrolitic graphite. The body thus formed is then removed from the mandrel and the graphite layer is machined to form a continuous spiral on the side and bottom surfaces of the cylindrical form. A second layer of pyrolitic boron nitride is then deposited over the machined graphite layer. Small holes are machined in this outer pyrolitic boron nitride layer in order to attach electrical leads, such as leads 748 and 750, to the embedded graphite layer. The graphite layer thus serves as an embedded heating element 746 for directly heating the flux distribution member 734.

A cylindrical heat shield 752 formed from a refractory metal and mounted about the cylindrical portion 734b of flux distribution member 734 is designed to localize the effects of heating elements 720, 722 and 746, and particularly to the source material and source material vapors within crucible 716 and exiting therefrom through diffuser plate 732 and flux distribution member 734. A thermocouple 754 having leads 756 and 758 may be connected to crucible 716 to measure the temperature of the source material disposed therein. The electrical leads from heating elements 720 and 722, and from thermocouple 754, may pass through apertures 712a and 712b in lower support cylinder 712 for connection to first portions of vacuum-tight electrical feedthroughs 760 and 762, respectively, arranged on base plate 710 so as to lie in the interior of the epitaxy unit. The electrical leads from heating element 746 may similarly be connected to electrical feedthroughs 760 and 762. The power sources and instrumentation (not shown) for connection to the several heating elements and thermocouple are connected to opposed portions of electrical feedthroughs 760 and 762 on the opposite face of base plate 710.

Source cell 700 operates with essentially the same principles as those described above in connection with apparatus 10 in order to deposit a substantially defect-free layer on the surface of a substrate. A predetermined quantity of a solid or liquid source material is placed in crucible 716 and the diffuser plate 732, ring spacer 744 and flux distribution member 734 are assembled thereover. Typically, source cell 700 will be assembled in a bakeout chamber and subjected to a preliminary bakeout step in which it is heated under vacuum conditions at or above the anticipated processing temperature in order to assure that any contaminants or other high vapor pressure materials are volatilized before they have the opportunity to contaminate the processing chamber of the epitaxy unit.

Following this preliminary bakeout procedure, source cell 700 is removed from the bakeout chamber and assembled in place in a conventional epitaxy unit. The source material is heated to a predetermined temperature in order to produce a vapor in the upper portion of crucible 716, which vapor then travels through apertures 733 in diffuser plate 732. Since the deliberate misalignment of apertures 733 and 735 creates a tortuous path, the vaporized source material is unable to pass directly out of source cell 700 through diffuser plate 732 and flux distribution member 734. Rather, after passing through the apertures in diffuser plate 732, molecules of the vaporized source material will collide with the surfaces of flux distribution member 734 and diffuser plate 732 until they become aligned with an aperture 735, at which point they can then pass through flux distribution member 734 and toward a target substrate for deposition thereon.

The presence of the embedded heating element 746 in flux distribution member 734, as well as the proximity of upper level heater 722 to diffuser plate 732, enables diffuser plate 732, and particularly flux distribution member 734, to be heated to temperatures above the vaporization temperature of the source material. These high temperatures cause any microscopic droplets of source material which may form in the upper portion of crucible 716 or in the region between diffuser plate 732 and flux distribution member 734 to be vaporized as they strike the heated surface of these components. Thus, since no source material droplets are able to pass through flux distribution member 734, the potential for such droplets forming defects on the surface of the target substrate is essentially eliminated. Moreover, since the vapor pressure between crucible 716 and flux distribution member 734 is greater than that beyond flux distribution member 734 in the processing chamber of the epitaxy unit, there is little potential for molecules of the source material to combine into droplets between the flux distribution member 734 and the target substrate. In the source cell embodiment shown in FIG. 14, a conventional shutter (not shown) will generally be interposed between flux distribution member 734 and the target substrate in order to intercept the vaporized source material flowing from the source cell and prevent same from reaching the target substrate.

Figure 14B:
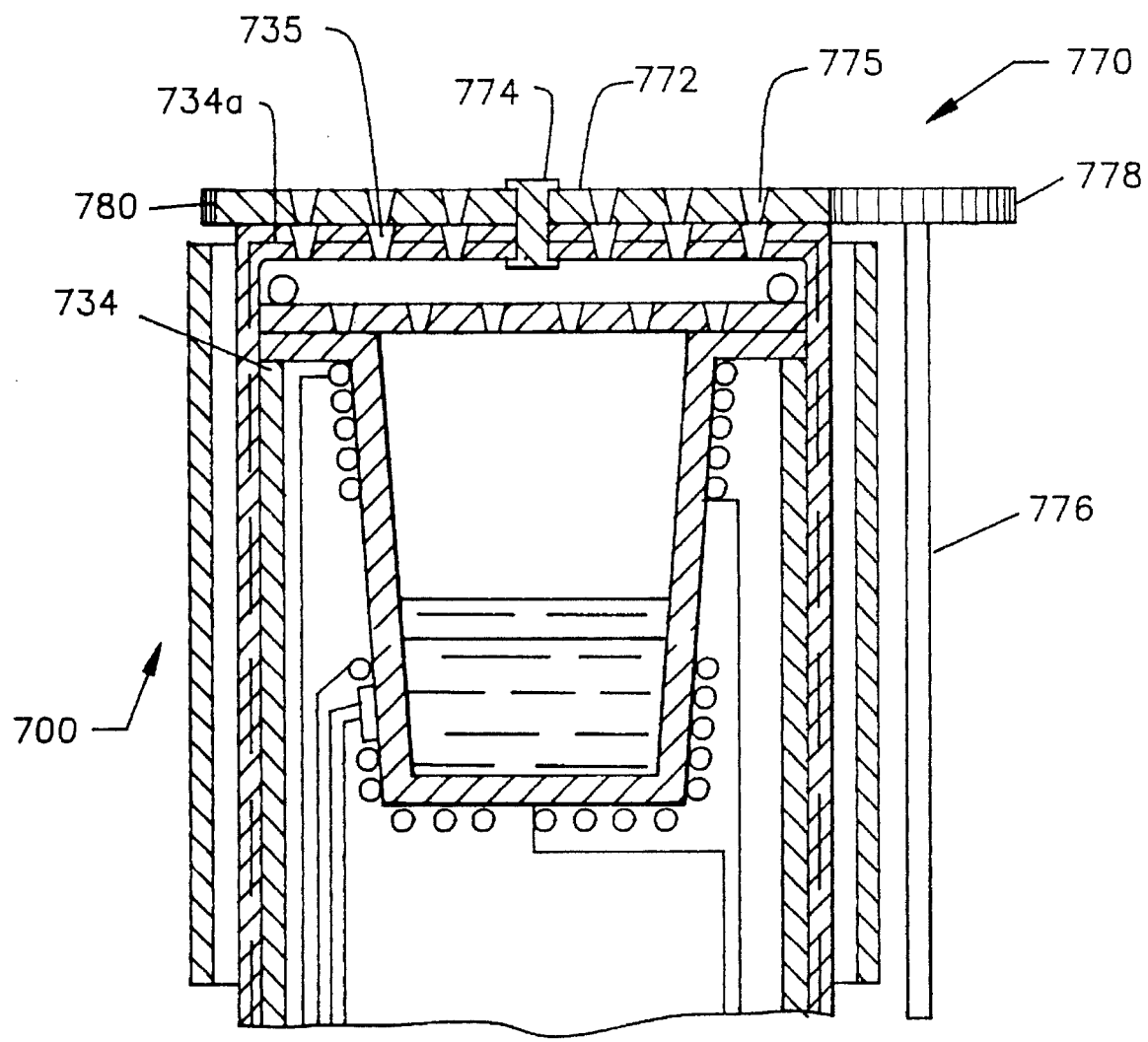
FIG. 14b is a partial sectional view of an alternate embodiment of the replacement source cell of FIG. 14a incorporating a valve mechanism therein.

Referring to FIG. 14b, source cell 700 may be constructed with an optional valve mechanism 770 for abruptly terminating the flow of source vapors toward the target substrate. Valve mechanism 770 consists of a plate 772 disposed on top of flux distribution member 734 and rotatably connected in surface contact with the apertured portion 734a thereof by a pivot member 774. Plate 772 includes a plurality of apertures 775 which are arranged in the same pattern as the apertures 735 formed in flux distribution member 734. Thus, plate 772 may be rotated to a position in which each of apertures 75 are in alignment with apertures 735, which position will enable the vaporized source material to pass through flux distribution member 734 and toward the target substrate for deposition. When it is desired to terminate the deposition process, plate 772 may be rotated to another position in which each of apertures 75 will be out of alignment with apertures 735. In this position, the flow of the source material vapors through apertures 735 will be occluded by plate 772, and the deposition process will be abruptly stopped.

In one arrangement, plate 772 may be rotated by a drive motor (not shown), such as a stepper motor located outside of reaction chamber 100. The drive motor may be connected through a rotary motion feedthrough (also not shown) in base plate 710 to a shaft 776 having a pinion gear 778 positioned on the end thereof. The pinion gear 778 engages gear teeth 780 formed on the periphery of plate 772 so that rotation of the drive motor in either a forward or reverse direction will result in a corresponding reverse or forward rotation of plate 772.

Figure 15C:
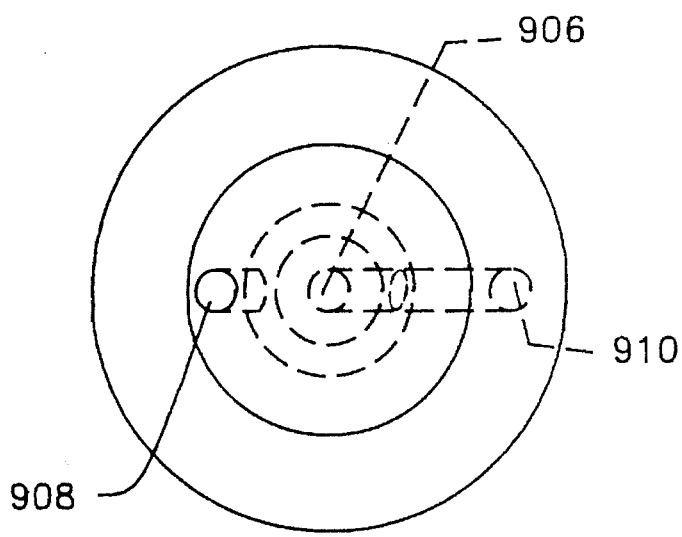
Figure 16D:
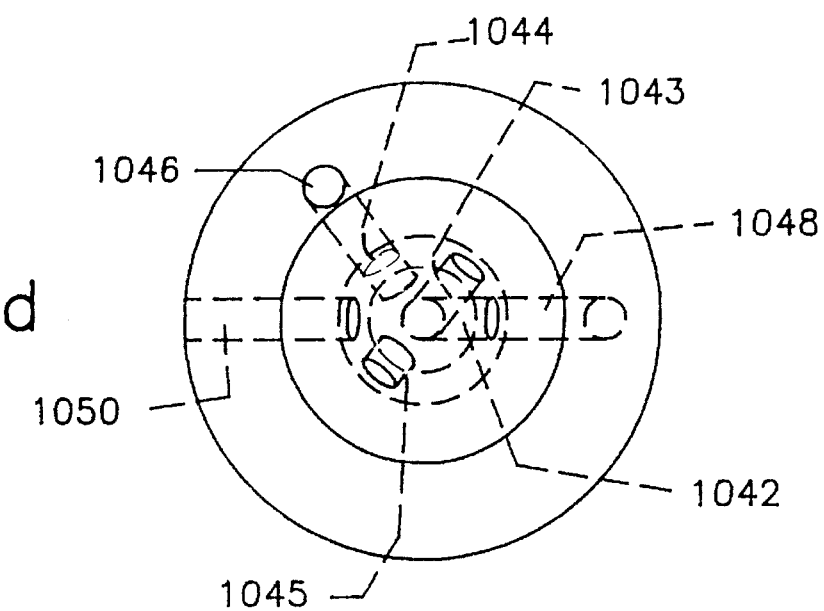
Figure 17C:
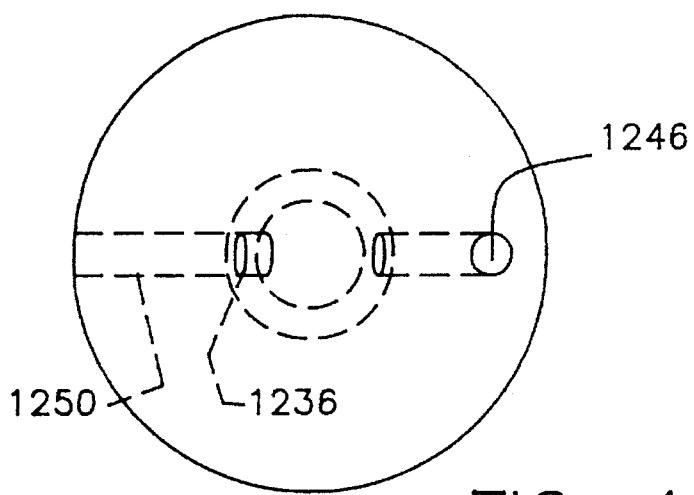

An alternate embodiment of a source cell 800 for use with source materials in vapor form is shown in FIG. 15a. Again, source cell 800 is designed to easily replace a conventional effusion cell in a molecular beam or chemical beam epitaxy unit. Base plate 810 is thus adapted to be bolted or otherwise connected to the processing chamber of an epitaxy unit and includes a support structure consisting of a lower support cylinder 812 and an upper support cylinder 814. Upper and lower support cylinders 812 and 814 together define a compartment 816 which is enclosed at one end by base plate 810 and which is enclosed at the other end by valve seat plate 818, the outer circumference of which is formed with an annular notch 818a for mating engagement with the annular lip 814a at the end of upper support cylinder 814. A retaining plate 820 includes an annular lip 822 which extends inwardly over lip 814a and a portion of valve seat plate 818 and which thus defines a large centrally disposed aperture 824. Upper support cylinder 814, valve seat plate 818 and retaining plate 820 are all formed from materials which can tolerate the high operating temperatures of source cell 800 without outgassing, and which will not react with the source materials under such operating conditions. Again, such materials typically include pyrolitic graphite, pyrolitic boron nitride, refractory metals such as tantalum and molybdenum, or combinations of these materials.

A first diffuser plate 826 having a plurality of apertures 828 is assembled above retaining plate 820 and maintained at a spaced distance therefrom by an annular ring spacer 830. Another annular ring spacer 832 maintains a spaced distance between the first diffuser plate 826 and a second diffuser plate 834 having a plurality of apertures 836 which are deliberately misaligned with the apertures 828 in first diffuser plate 826. A third annular ring spacer 833 is positioned over diffuser plate 834 and keeps a cylindrical flux distribution member 838, assembled over the first and second diffuser plates 826 and 834 and extending downwardly around retaining plate 820 and upper support cylinder 814, at a spaced distance from diffuser plate 834. Retaining clamps 840 and 842, connected at their lower ends to base plate 810 by spring loaded tension bolt assemblies 844 and 846, respectively, hold flux distribution member 838 securely in place. Retaining clamps 840 and 842 may optionally be replaced with a cylindrical retaining clamp as previously described.

Annular ring spacers 830, 832 and 833, and diffuser plates 826 and 834 are again formed from the same materials as are used to form annular ring spacer 744 and diffuser plate 732, while flux distribution member 838 has a similar construction and is formed from the same materials as flux distribution member 734, all of which is described above in connection with source cell 700. Thus, flux distribution member 838 includes a plurality of apertures 848 which are in deliberate misalignment with the apertures 836 in second diffuser plate 834 (although apertures 848 may be aligned with apertures 828 in first diffuser plate 826). In addition, flux distribution member 838 has outer and inner layers preferably formed from pyrolitic boron nitride, with a pyrolitic graphite heating element 850 embedded therein for heating both the apertured portion 838a and the cylindrical portion 838b thereof. Power is supplied to heating element 850 through a pair of electrical leads 852 and 854.

Valve seat plate 818 and the region around same are heated by a heating element 856 which may be formed by winding a conductive wire around the upper periphery of upper support cylinder 814 and connecting the wire through electrical leads 858 and 860 to a power source. A cylindrical heat shield 862 mounted about the cylindrical portion 838b of flux distribution member 838 and formed from a refractory metal localizes the heat generated by heating elements 850 and 856, and concentrates that heat towards the upper central region of source cell 800. The temperature in that region is measured by a thermocouple 864 which may be connected to retaining plate 820 and which includes electrical leads 864a and 864b. The electrical leads from heating elements 850 and 856, as well as from thermocouple 864, may be connected to power supplies and other instrumentation outside of the epitaxy unit through vacuum-tight electrical feedthroughs 866 and 867 in base plate 810.

Source cell 800 includes a valve system which enables the flow of a source gas to be precisely controlled during the deposition process. The source gas is supplied through an inlet 868 to a tubular member 869 which extends in a vacuum-tight manner through base plate 810 into compartment 816. One end of tubular member 869 is enclosed by an end plate 869a which has a central opening for rotatably receiving the hollow flow tube 870 of a valve mechanism 872. A radial aperture 870a formed in a bottom portion of flow tube 870 provides a passageway between the interior of flow tube 870 and tubular member 869. Flow tube 870 is connected through coupling 871 to one end of shaft 873 for rotation therewith. Shaft 873 then projects through an opening in a flange 874 formed at the other end of tubular member 869 where it is operatively connected to drive assembly 875 which includes a stepper motor 876 having a flange 877 formed at one end. Stepper motor 876 is bolted or otherwise removably connected to flange 874 through a flexible bellows 880 having a flange 881 at one end which is connected in a vacuum-tight manner to flange 874, and a flange 882 at the other end. A commercially available rotary motion feedthrough 884, such as that manufactured by Ferrofluidics Corp. of Nashua, N.H., enables a rotatable connection to be made between stepper motor 876 and shaft 873 while maintaining the vacuum environment within the epitaxy unit. Rotary motion feedthrough 884, shown schematically in FIG. 15a, includes flanges 886 and 888 for connection between bellows 880 and stepper motor 876. A thin impervious membrane 890 is sandwiched between flanges 886 and 888 and provides a vacuum-tight barrier between bellows 880 and ambient conditions. By making membrane 890 as thin as possible, a magnet 892 provided at the end of stepper motor shaft 894 can couple with a magnet 896 formed at the end of shaft 873, thereby providing rotational movement to shaft 873 without compromising the vacuum conditions within the epitaxy unit.

At its other end, flow tube 870 is formed with a valve 900 which has a frusto-conically shaped portion 902 for mating engagement with a similarly shaped recess in valve seat plate 818, and a flange 904 for seating valve 900 against valve seat plate 818. The seating of valve 900 against valve seat plate 818 is maintained by an axial force constantly exerted by flow tube 870 and shaft 873 through their connection to drive assembly 875. Bellows 880 will accommodate any axial expansion or contraction of flow tube 870 which may occur as source cell 800 is cycled between room temperature and its elevated operating temperatures.

Valve 900 may be formed from the same high temperature inert materials which form valve seat plate 818. However, it is frequently desirable to form each of valve 900 and valve seat plate 818 from a different one of these materials or to form these components from the same material and coat one of the components with a different high temperature inert material to avoid sticking as valve 900 is rotated in valve seat plate 818. As will be discussed more fully below, valve 900 includes a bore 906 having a dogleg configuration which, upon rotation of valve mechanism 872, is adapted to selectively align with one of bores 908 and 910 in valve seat plate 818 to provide flow passageways for the source gas in different operating modes of source cell 800.

As noted above, it is intended that source cell 800 be used with source materials supplied thereto in vapor form. In that regard, it is not imperative that the source materials generally exist in a gaseous form, but only that they be supplied to source cell 800 in the form of a vapor. Thus, while source materials which exist as a gas at ambient temperature may be supplied directly to inlet 868, a vapor may be supplied thereto by bubbling an inert carrier gas through a liquid source material contained in a bubbling apparatus, such as described above in connection with apparatus 10. Furthermore, the vapor source may be derived from a solid source material by passing an inert carrier gas through an externally located furnace for heating and vaporizing the source material.

In any event, the source material vapor is introduced through inlet 868 into tubular member 869, whereupon it travels through aperture 870a upwardly through flow tube 870 and into bore 906 in valve 900. From valve 900, the source material vapor can be directed either outwardly through flux distribution member 838 for deposition on a target substrate, or inwardly for eventual removal from source cell 800 through an exhaust system.

The position of valve 900 determines whether source cell 800 is in a "run" configuration or a "vent/purge" configuration. In the run mode, valve 900 is positioned so that bore 906 is aligned with bore 908 in valve seat plate 818. In this configuration, the source vapor is able to flow from flow tube 870 through bores 906 and 908 and then through the apertures in diffuser plates 826 and 834 and flux distribution member 838. As with source cell 700, the deliberate misalignment of apertures 828, 836 and 848 creates a tortuous path which prevents the source vapor from passing directly from bore 908 toward the target substrate. To the contrary, after passing through apertures 828, molecules of the source vapor must first collide with the surfaces of heated diffuser plates 826 and 834 before passing through apertures 836, and must then collide with the surfaces of diffuser plate 834 and heated flux distribution member 838 before passing through apertures 848 for deposition on the target substrate. This indirect flow path lengthens the period of time that the source vapor dwells in the heated region between valve seat plate 818 and flux distribution member 838, thereby creating a zone in which any organic constituents in the source material vapors may be broken down or decomposed. For those source materials which are difficult to decompose, this decomposition zone can be increased by interposing additional diffuser plates between valve seat plate 818 and flux distribution member 838. Similarly, for more readily decomposed materials, diffuser plate 834 may be removed from the assembly. Thus, the number of diffuser plates provided in source cell 800 will generally depend on how difficult it is to decompose the source material. In addition, by forcing the source vapor to travel through a tortuous path between bore 908 and the target substrate, the potential for surface defects caused by droplets of source material is essentially eliminated. That is, any microscopic source material droplets extant in the system will be vaporized by frequent contacts with the heated diffuser plates 826 and 834 and flux distribution member 838 prior to passing through apertures 848. Moreover, the lower pressure beyond flux distribution member 838 in comparison to the pressure in the region between flux distribution member 838 and valve seat plate 818 will substantially prevent the source material vapor from reforming into droplets prior to depositing on the target substrate.

Rotating valve mechanism 872 so that bore 906 no longer is in alignment with bore 908 will prevent additional source vapors from flowing through flow tube 870 and out therefrom towards the diffuser and flux distribution members. As a result, once the residual vapors which lie between valve seat plate 818 and flux distribution member 838 exit through apertures 848, no additional source vapors will be directed towards the target substrate. Continued rotation of valve mechanism 872 to the position shown in FIG. 15b will place source cell 800 in the vent/purge mode in which bore 906 is in alignment with bore 910 in valve seat plate 818. In this configuration, the source vapors travelling up through flow tube 870 into bore 906 will be diverted through bore 910 into compartment 816 in source cell 800. These vapors can then be exhausted from compartment 816 by a vacuum pump (not shown) connected to exhaust outlet 912. Moreover, compartment 816 can be purged of all source vapors by removing the supply of source material from the vapor introduced through inlet 868 and flushing an inert carrier gas through tubular member 869, flow tube 870 and compartment 816.

Such procedure will enable a different source material vapor to be introduced through inlet 868 for deposition on the target substrate, and will prevent this material from becoming contaminated with any remnants of the original source material vapor which otherwise would remain in source cell 800 after deposition of that material had been stopped.

It can thus be seen that the valve system of source cell 800 not only improves upon the shutter systems conventionally employed in molecular beam or chemical beam epitaxy units inasmuch as it positively stops the flow of the source vapor towards the target substrate, but that it does so within the processing chamber at a location relatively close to the target substrate. As a result, very little residual source material flows from source cell 800 to the target substrate once the valve has been closed, thus terminating the deposition process almost instantaneously. By providing source cell 800 with additional inlets 868, or by changing the source materials supplied through inlet 868, it will be appreciated that layers of different source materials can be deposited on a target substrate with abrupt transitions between adjacent layers.

FIG. 16a shows a source cell 1000 which has a similar construction to source cell 800, but which is preferably used for the deposition of solid elemental source materials having a low vapor pressure, although this embodiment may also be used for depositing solid elemental source materials having a high vapor pressure, as well as liquid source materials. Source cell 1000 includes a base plate 1010 which is adapted to be bolted or otherwise connected to the processing chamber of an epitaxy unit. A tubular member 1012 which extends in a vacuum-tight manner through base plate 1010 includes an inlet 1014 for supplying an inert carrier gas, such as hydrogen, to source cell 1000. One end of tubular member 1012 is enclosed by an end plate 1016 having a central opening for rotatably receiving the hollow flow tube 1018 of a valve mechanism 1020, which flow tube 1018 is provided with a radial aperture 1022 for forming a passageway between tubular member 1012 and the interior of flow tube 1018. At one end, flow tube 1018 is connected by a coupling 1024 for rotation with shaft 1026 which, in turn, is connected through bellows 1028 and rotary motion feedthrough 1030 to a stepper motor 1032 in essentially the same manner as described above in connection with source cell 800.

The other end of flow tube 1018 is formed with a valve 1034 having a frusto-conically shaped portion 1036 which matingly engages with a similarly shaped recess in a valve seat plate 1038, and having a flange 1040 for seating valve 1034 against valve seat plate 1038. Again, any expansion or contraction of flow tube 1020 which may occur as source cell 1000 is heated and cooled is accommodated in the axial direction by bellows 1028, thus enabling an axial force to be constantly exerted through flow tube 1018 to hold valve 1034 in seating engagement with valve seat plate 1038. Valve 1034 further includes dogleg shaped bores 1042, 1043, 1044 and 1045 which may be selectively aligned with bores 1046, 1048 and 1050 in valve seat plate 1038 (bore 1050 also passes through outer crucible enclosure 1066, as will be discussed further below) by rotating valve mechanism 1020 to thereby form various passageways in different operating modes of source cell 1000.

A crucible 1052 assembled in source cell 1000 has a centrally disposed cylindrical portion 1054 for receiving flow tube 1018, and is fixed longitudinally with respect to flow tube 1018 by a disk-shaped bulge or washer 1056 formed or assembled thereon. A retaining ring 1058 preferably assembled by a press fit to cylindrical portion 1054 near the top of crucible 1052 has an aperture 1060 for receiving down tube 1062 and holding same in place with one end in alignment with bore 1048 and the other end depending into source material 1064.

An outer crucible enclosure 1066 is assembled, preferably also in a press-fit fashion, over valve seat plate 1038 and crucible 1052, and includes an annular lip 1068 which extends inwardly over valve seat plate 1038 to define a large central aperture 1070. Crucible 1052, washer 1056, retaining ring 1058, down tube 1062 and outer crucible enclosure 1066 may all be formed from the same high temperature, inert materials described above, including pyrolitic graphite, pyrolitic boron nitride, refractory metals such as tantalum and molybdenum, or combinations of these materials.

A flux distribution member 1072, having essentially the same construction as the flux distribution members described above, is assembled over outer crucible enclosure 1066, sealing against annular lip 1068 and extending downwardly around crucible 1052 for assembly to a lower support cylinder 1074. Flux distribution member 1072 includes a cylindrical portion 1072b and an apertured portion 1072a including apertures 1073, both of which are preferably heated by a pyrolitic graphite heating element 1078 embedded between inner and outer layers formed from pyrolitic boron nitride. A pair of electrical leads 1080 and 1082 supply power to heating element 1078. Flux distribution member 1072 and lower support cylinder 1074 together define a compartment 1084, the end of which is enclosed by base plate 1010.

A second flux distribution member 1086, having a larger diameter than flux distribution member 1072 but being otherwise substantially similar thereto, is assembled over flux distribution member 1072 and is kept at a spaced distance therefrom by annular ring spacer 1088. Flux distribution member 1086 also includes a cylindrical portion 1086b and an apertured portion 1086a including apertures 1089, both of which are heated by a pyrolitic graphite heating element 1090 embedded between inner and outer layers of pyrolitic boron nitride. Power is supplied to heating element 1090 through a pair of electrical leads 1092 and 1094.

A cylindrical heat shield 1096 mounted about the cylindrical portion 1086b of flux distribution member 1086 localizes the effects of heating elements 1078 and 1090, particularly towards the crucible 1052 and the source material 1064 therein. A second heat shield 1098 assembled on flow tube 1018 below crucible 1052 acts to localize the heat around crucible 1052 in the upper region of source cell 1000. Heat shields 1096 and 1098 are preferably formed from the same refractory metals as the heat shields previously described above. The temperature around crucible 1052 may be monitored by a thermocouple 1100 mounted on outer crucible enclosure 1066 and having electrical leads 1102 and 1104. The electrical leads from thermocouple 1100 may be connected to a vacuum-tight electrical feedthrough 1106 on base plate 1010, while the electrical leads from heating elements 1078 and 1090 may be connected to vacuum-tight electrical feedthroughs 1108 and 1110.

Although source cell 1000 is preferably employed to deposit solid source materials having a low vapor pressure, it may also be advantageously used to deposit solid source materials having a high vapor pressure or liquid source materials. Regardless of the type of material being employed, the source material is placed in crucible 1052 and outer crucible enclosure 1066, flux distribution members 1072 and 1086, and the various other components of source cell 1000 are assembled together. Source cell 1000 will then typically be fitted in a bakeout chamber and subjected to a preliminary bakeout step conducted at or above the anticipated processing temperature to assure that any contaminants are volatilized and will not corrupt the epitaxy unit.

Following this preliminary bakeout step, source cell 1000 is assembled in the epitaxy unit and the source material is heated to a predetermined temperature. A carrier gas, such as hydrogen, is then supplied to source cell 1000 through inlet 1014. The carrier gas flows from tubular member 1012 through aperture 1022 and then upwardly through flow tube 1018 towards valve 1034. Depending on the position of valve 1034, the carrier gas will be directed through one of three paths—downwardly into the source material 1064, whereupon it will carry a vapor of the source material for eventual deposition on a target substrate; outwardly into compartment 1084 for eventual removal from source cell 1000 through an exhaust system; or directly outward through flux distribution members 1072 and 1086 in order to purge the system of any remnant source material vapors.

Figure 16B:
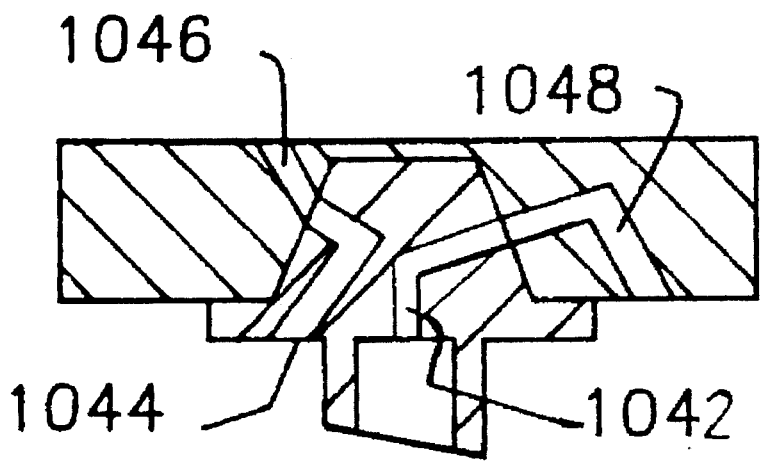
FIG. 16b is an enlarged partial sectional view showing the valve mechanism of the source cell of FIG. 16a in the run position.

In the "run" configuration of source cell 1000, valve 1034 is rotated to the position shown in FIG. 16b, in which bore 1042 is aligned with bore 1048, bore 1044 is aligned with bore 1046, and bores 1043 and 1045 are not aligned with any bores in valve seat plate 1038. In this configuration, the carrier gas will flow from flow tube 1018 through bores 1042 and 1048 and into down tube 1062 which will direct the carrier gas into source material 1064. As the carrier gas percolates through the heated source material, be it solid or liquid, it will carry molecules of the source material as a vapor upwardly towards valve seat plate 1038. As a result of the tight fit of the outer crucible enclosure 1066 around valve seat plate 1038 and crucible 1052, the combined vapor will be forced to flow through bores 1044 and 1046 and then through the apertures 1073 and 1089 in flux distribution members 1072 and 1086. As in the previous embodiments, a tortuous path is created by the deliberate misalignment of apertures 1073 and 1089, thereby preventing the combined vapor from passing directly from bore 1046 toward the target substrate. The combined vapor will therefore collide with the heated surfaces of flux distribution members 1072 and 1086 before finally passing through apertures 1089 whereupon it can be deposited on the target substrate. Since source cell 1000 is preferably used with solid elemental source materials, there is generally no need to create a region for the decomposition of any organic constituents. However, in the event a metalorganic liquid or other organic-containing source material is to be employed with source cell 1000, the present invention contemplates that apertured diffuser plates may be interposed between flux distribution members 1072 and 1086 in order to create such a decomposition zone by lengthening the tortuous path through which the combined vapors would have to travel.

Figure 16C:
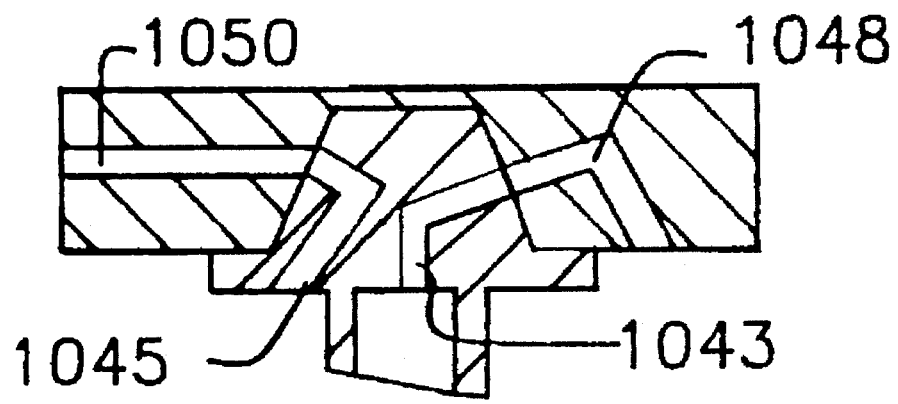
FIG. 16c is an enlarged partial sectional view showing the valve mechanism of the source cell of FIG. 16a in the vent position.

By actuating stepper motor 1032, valve mechanism 1020 may be rotated to convert source cell 1000 from the run configuration to either a "vent" or "purge" configuration. In the vent configuration, shown in FIG. 16c, bore 1043 will be aligned with bore 1048 in valve seat plate 1038. In this configuration, as in the run mode, the carrier gas will be directed into the source material and will carry molecules of the source material upwardly as a vapor towards valve seat plate 1038. However, in this vent mode, bore 1044 is not aligned with bore 1046, but rather a different bore 1045 is aligned with bore 1050 in valve seat plate 1038 and outer crucible enclosure 1066, thus creating a flow passageway from the interior of crucible 1052 through valve 1034, valve seat plate 1038 and crucible enclosure 1066, and into compartment 1084 from which the vapors may be exhausted by a vacuum pump (not shown) connected to exhaust outlet 1112. Thus, by rotating valve mechanism 1020 from the run position to the vent position, the flow of the source vapor will be diverted away from the target substrate to an exhaust outlet.

Rotating valve mechanism 1020 to a third position will place source cell 1000 in the third operating mode illustrated in FIG. 16a, referred to as the "purge" mode. In the purge mode, bore 1043 will be aligned with bore 1046 in valve seat plate 1038, thus creating a direct path through which the carrier gas can flow from flow tube 1018, through valve seat plate 1038, and then through flux distribution members 1072 and 1086. This flow path enables the carrier gas to sweep away or "purge" any remnant source vapors from the region between valve seat plate 1038 and the target substrate. In the event an epitaxy unit is fitted with more than one source cell 1000, the ability to "purge" a source cell after a period of deposition enables abrupt transitions to be achieved between adjacent layers of different source materials while, at the same, minimizing the overall deposition time.

Figures 17A, 17D:
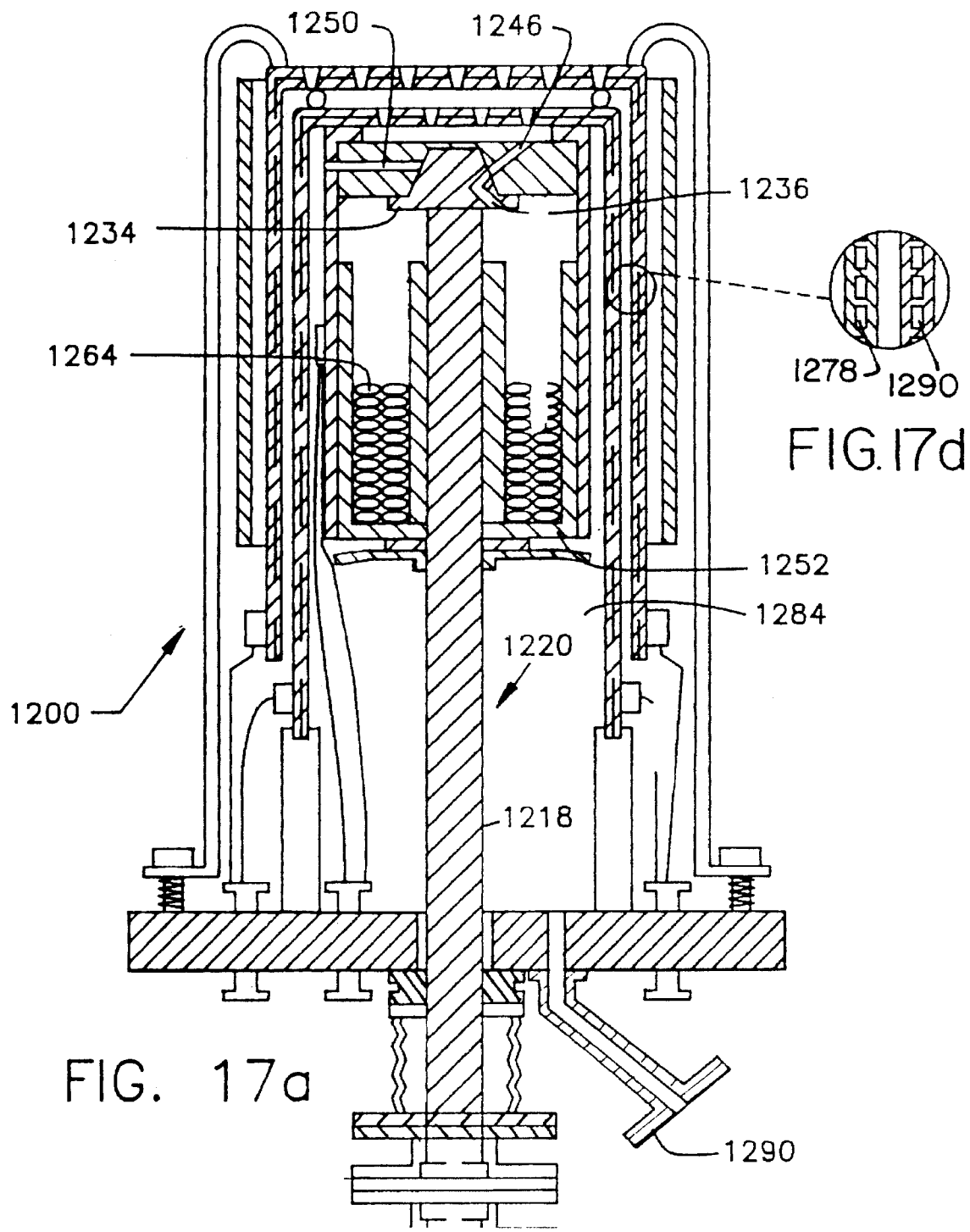

Yet another embodiment of a source cell, indicated generally at 1200, is shown in FIG. 17a. Source cell 1200 is substantially the same as source cell 1000 described above, except that source cell 1200 does not employ a carrier gas. Accordingly, valve mechanism 1220 may have a solid shaft 1218 operatively connected between stepper motor 1232 and valve 1234, rather than a hollow flow tube. Since its ability to accommodate a carrier gas has been eliminated, source cell 1200 can no longer operate in the purge mode described above in connection with source cell 1000. Therefore, valve 1234 need only have a single bore 1236, and valve seat plate 1238 need only have two bores 1246 and 1250, for source cell 1200 to operate as intended.

After source cell 1200 has been assembled in an epitaxy unit, heaters 1278 and 1290 are operated to cause the source material 1264 in crucible 1252 to volatilize. Depending upon the position of valve 1234, these volatilized vapors will be directed to flow through one of two paths. In the "run" mode, stepper motor 1232 will rotate shaft 1218 until bore 1236 is aligned with bore 1246 in valve seat plate 1238. In this configuration, the vaporized source material near the top of enclosed crucible 1252 will travel through bores 1236 and 1246, then through the apertures in flux distribution members 1272 and 1286 toward the target substrate. Again, the apertures in flux distribution members 1272 and 1286 are deliberately misaligned so as to create a tortuous path through which the vaporized source material must travel. As a result, the source vapor will collide with the heated surfaces of flux distribution members 1272 and 1286 before passing from source cell 1200, evaporating any droplets of source material which may have formed previously. In the event that source material 1264 contains organic components, diffuser plates may be interposed between flux distribution members 1272 and 1286 in order to lengthen the tortuous path and create a heated zone in which the source material may be decomposed.

Source cell 1200 may be placed in a "vent" mode by rotating shaft 1218 so that bore 1236 is aligned with bore 1250 in valve seat plate 1238 and crucible enclosure 1066. In this configuration, the source material vapors entering bore 1236 from enclosed crucible 1252 will be directed through bore 1250 and into compartment 1284 from which the vapors may be exhausted through outlet 1290. Thus, in this embodiment, valve 1234 acts as an on-off valve for terminating the flow of source material vapors at a location near the target substrate. By employing several source cells similar to source cell 1200 in a single epitaxy unit, layers of different materials may be deposited on a substrate with rather sharp transitions obtainable between adjacent layers.

Although the invention herein has been described with reference to particular embodiments, it is to be understood that these embodiments are merely illustrative of the principals and applications of the present invention. It is therefore to be understood that numerous modifications may be made to the illustrative embodiments and that other arrangements may be devised without departing from the spirit and scope of the present invention as set forth in the appended claims.

We claim:

1. A method for depositing a coating of a composition on a substrate, comprising the steps of:

supporting said substrate within a housing, evacuating said housing, providing vapors of materials for forming said composition to said housing, placing said vapors in a molecular flow condition by passing said vapors through an orifice having a variable cross-section to substantially decrease the pressure of said vapors, controlling the flow of said vapors by adjusting said cross-section of said orifice, and conducting said vapors under said molecular flow condition through a path in said housing having heated surfaces whereby said vapors contact said heated surfaces before depositing on said substrate.

2. The method as claimed in claim 1 wherein said step of providing vapors of materials for forming said composition to said housing further comprises the steps of:

conducting a vapor of a first material for forming said composition through a first inlet, terminating the flow of said vapor of said first material by occluding said first inlet within said housing at a location adjacent said substrate, and conducting a vapor of a second material for forming said composition through a second inlet.

3. The method as claimed in claim 2 wherein said step of occluding said first inlet includes moving a valve element disposed in said inlet from a non-occluding position to an occluding position.

4. The method as claimed in claim 1 wherein said step of providing vapors of materials for forming said composition to said housing comprises the step of generating said vapors within said housing adjacent said path.

5. The method as claimed in claim 1 further comprising the step of conducting said vapors through a valve movable between a run position and a vent position, said valve in said run position directing said vapors toward said path, and said valve in said vent position directing said vapors away from said path.

6. The method as claimed in claim 5 further comprising the step of supplying a carrier gas to said housing, wherein said valve means is movable to a purge position for terminating the flow of said vapor and directing said carrier gas toward said path for purging a remnant portion of said vapor from said path.

7. The method as claimed in claim 1 further comprising the steps of:

providing a vapor of a first material for forming said composition to said housing, and providing a vapor of a second material for forming said composition to said housing, wherein said vapors of said first and second materials are at least partially mixed together in said path.

8. A method for depositing a coating of a composition on a substrate, comprising the steps of:

supporting said substrate within a housing, evacuating said housing, providing vapors of materials for forming said composition to said housing through an inlet, said inlet having a restriction to substantially decrease the pressure of said vapors so as to place said vapors in a molecular flow condition, said restriction having a variable cross-section, controlling the flow of said vapors by adjusting said cross-section of said restriction, and terminating the flow of said vapors by occluding said inlet within said housing.

* * * * *

UNITED STATES PATENT AND TRADEMARK OFFICE
CERTIFICATE OF CORRECTION

PATENT NO. : 5,544,618

DATED : August 13, 1996

INVENTOR(S) : Stall et al.

It is certified that error appears in the above-indentified patent and that said Letters Patent is hereby corrected as shown below:

Column 1, line 10, "DASG60-91-0059" should read --DASG60-91-C-0059--.
Column 10, line 50, "34" should read --134--.

Column 20, line 58, "$2x10^5$" should read --$2x10^{-5}$--.
Column 25, line 27, "75" should read --775--.
Column 25, line 32, "75" should read --775--.

Signed and Sealed this

Twenty-fourth Day of December, 1996

Attest:

BRUCE LEHMAN

Attesting Officer        Commissioner of Patents and Trademarks

UNITED STATES PATENT AND TRADEMARK OFFICE
CERTIFICATE OF CORRECTION

PATENT NO.   : 5,544,618
DATED        : August 13, 1996
INVENTOR(S)  : Richard A. Stall et al.

It is certified that error appears in the above-identified patent and that said Letters Patent is hereby corrected as shown below:

<u>Title page,</u>
Insert: -- [73] Assignee: Emcore Corporation --.

Signed and Sealed this

Twentieth Day of January, 2004

JON W. DUDAS
*Acting Director of the United States Patent and Trademark Office*